United States Patent
Allred

(10) Patent No.: US 7,191,025 B2
(45) Date of Patent: Mar. 13, 2007

(54) VARIABLE DIGITAL HIGH AND LOW PASS FILTERS

(75) Inventor: Rustin W. Allred, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 708 days.

(21) Appl. No.: 10/326,517

(22) Filed: Dec. 20, 2002

(65) Prior Publication Data

US 2004/0122540 A1 Jun. 24, 2004

(51) Int. Cl.
*G06F 17/00* (2006.01)
*G06F 17/10* (2006.01)

(52) U.S. Cl. .................................. 700/94; 708/300
(58) Field of Classification Search ............. 700/94; 381/98, 103, 99; 708/300, 311, 314, 322, 708/323; 327/552, 558, 559
See application file for complete search history.

(56) References Cited

U.S. PATENT DOCUMENTS

| | | | |
|---|---|---|---|
| 5,488,576 A * | 1/1996 | Main ......................... | 708/300 |
| 5,910,904 A * | 6/1999 | Uramoto .................... | 708/300 |
| 5,928,311 A * | 7/1999 | Leavy et al. ............... | 708/300 |
| 6,581,080 B1 * | 6/2003 | Richards .................... | 708/320 |
| 6,892,103 B1 * | 5/2005 | Allred et al. .............. | 700/94 |
| 6,898,470 B1 * | 5/2005 | Rao et al. .................. | 700/94 |
| 6,970,896 B2 * | 11/2005 | Awad et al. ............... | 708/322 |
| 2004/0044713 A1 * | 3/2004 | Healey et al. ............. | 708/322 |
| 2005/0120067 A1 * | 6/2005 | Koyanagi ................... | 708/300 |
| 2005/0273482 A1 * | 12/2005 | Moore ........................ | 708/300 |

* cited by examiner

*Primary Examiner*—Xu Mei
(74) *Attorney, Agent, or Firm*—Warren L. Franz; W. James Brady; Frederick J. Telecky, Jr.

(57) ABSTRACT

A system (10) for providing an integer number N of filters. The system comprises an input ($D_i$) for receiving a digital audio signal and an output ($D_o$) for providing a filtered audio signal. The system also comprises circuitry (16) for storing at least a first set of fixed filter coefficients and circuitry for storing estimation data. The system also comprises circuitry (14) for estimating a number of sets of estimated filter coefficients in response to the estimation data and the fixed filter coefficients. The system also comprises circuitry (14) for applying a transfer function to the digital audio signal and in response for providing the filtered audio signal. The circuitry for applying the transfer function applies a set of filter coefficients selected from the first set of fixed filter coefficients and the sets of estimated filter coefficients. Also, the transfer function is selected from a transfer function set consisting of a high pass filter transfer function and a low pass filter transfer function.

44 Claims, 9 Drawing Sheets

VARIABLE DIGITAL HIGH AND LOW PASS FILTERS

CROSS-REFERENCES TO RELATED APPLICATIONS

This application is related to U.S. patent application Ser. No. 09/408,095, entitled "Digital Tone Control With Linear Step Coefficients," filed Sep. 27, 1999.

STATEMENT REGARDING FEDERALLY SPONSORED RESEARCH OR DEVELOPMENT

Not Applicable.

BACKGROUND OF THE INVENTION

The present embodiments relate to electronic audio signal processing circuits and are more particularly directed to a variable digital high and low pass filter, as may be implemented together in a variable digital crossover.

Electronic circuits have become prevalent in numerous applications, including uses for devices in personal, business, and other environments. Demands of the marketplace affect many aspects of circuit design, including factors such as device complexity and cost. Various electronic circuits are directed to audio signal processing and, quite often, these circuits also are subject to these design factors. Audio signal processing has evolved over a considerable period of time, and as such various techniques have been implemented in efforts to reduce complexity and cost, yet at the same time while maintaining or even improving sound performance. Further, over the evolution of sound processing, digital circuits have grown in popularity to replace large portions of sound processing circuits that were formerly implemented with analog components. Also driving the move to digital circuit implementations is the fact that many sources of audio signals are now presented in digital format, including by ways of example but without limitation, digital tapes, compact disks, digital video disks ("DVDs"), as well as the output from digital interfaces on many contemporary audio output devices such as tuners, computers, DVD/CD/MP3 players, televisions, satellite receivers, and so forth.

In the field of audio signal processing, one known devices is referred to as an audio crossover. A crossover typically includes both a low pass and a high pass filter, and it is used to separate, from a single audio signal, the lower frequency components from the higher frequency components. A common and preferred use for such a device is to drive one or more speakers, where certain speakers or speaker components are preferred to be driven with the signal lower frequency components while other speakers or speaker components are preferred to be driven with the signal higher frequency components. For example, often a single speaker may include a separate woofer that has a favorable response to low frequency signals, while that same speaker also includes a tweeter that has a favorable response to high frequency signals. With such a speaker, a crossover can be connected to an audio signal so that the lower frequency components of the signal are directed to the speaker woofer while the higher frequency components of the signal are directed to the speaker tweeter. Such an approach also may be used in more complex systems, but in any event often produces a more quality and pleasing sound to a listener.

As mentioned earlier, a crossover typically includes both a low pass and a high pass filter, and by way of further introduction such filters are now explored in greater detail in connection with the prior art illustrations of FIG. 1. Toward the right of FIG. 1, it illustrates a frequency response $FR_1$ in the recognized shape of a high pass filter, and at the same time FIG. 1 also illustrates a frequency response $FR_2$ in the recognized shape of a low pass filter toward the left of the figure. Each of these frequency responses is discussed separately, below. Further, from this discussion, one skilled in the art will appreciate that the low pass filter portion of a crossover may be used to pass low frequency components of an audio signal to a speaker woofer, while the high pass filter portion of a crossover may be used to pass high frequency components of an audio signal to a speaker tweeter.

With respect to frequency response $FR_1$, it has a corner frequency $CF_1$, which typically is defined in the art to occur at 3 dB below the horizontal asymptote of the filter; in the example illustrated, the horizontal asymptote is at 0 dB and, thus, corner frequency $CF_1$ occurs at approximately 50 Hz. As an aside, for some filters the corner is defined at different levels, such as at 6 dB below the filter's horizontal asymptote. In any event, at frequencies greater than corner frequency $CF_1$, the response approaches the asymptote of 0 dB, meaning a gain of 1. In other words, for signals input to the high pass filter and higher than its corner frequency $CF_1$, generally those high-frequency signals are not affected by the filter as indicated by the 0 dB asymptote, that is, they "pass" unaffected from the filter input to the filter output; hence, the filter is referred to as a high pass filter. In contrast, at frequencies less than corner frequency $CF_1$, the response tends toward negative infinity. As a result, the filter suppresses these lower-frequency signals from the filter output. Also, in a practical implementation, a high pass filter response may tail off to some finite value far below the 0 dB asymptote, but that value is typically selected to be considerably below what should be audible when the signal is ultimately output via a speaker or the like, or is at least low enough to achieve the desired purpose. For example, such a tail may occur at a level on the order of −100 dB. In any event, when connecting an audio signal, by way of example, through a high pass filter of a crossover to a speaker tweeter, only the higher frequency signals pass unaffected to the tweeter, while the remaining signals are eliminated and, thus, are not presented to the tweeter.

With respect to frequency response $FR_2$, it has a corner frequency $CF_2$, which also is typically defined in the art to occur at 3 dB below the horizontal asymptote of the filter; in the example illustrated, the horizontal asymptote is at 0 dB and, thus, corner frequency $CF_2$ occurs at approximately 200 Hz. Once more, the corner frequency may be defined at a different level, such as at 6 dB below the filter's horizontal asymptote. At frequencies less than corner frequency $CF_2$, the response approaches the asymptote of 0 dB, meaning a gain of 1. In other words, for signals input to the low pass filter and lower than its corner frequency $CF_2$, generally those low-frequency signals are not affected by the filter as indicated by the 0 dB asymptote, that is, they "pass" unaffected from the filter input to the filter output; hence, the filter is referred to as a low pass filter. In contrast, at frequencies greater than corner frequency $CF_2$, the response tends toward negative infinity. As a result, the filter suppresses these higher-frequency signals from the filter output. Also, in a practical implementation, a low pass filter also may tail off to some finite value far below the 0 dB asymptote, such as on the order of −100 dB below the asymptote, where that value is typically selected to be considerably below what should be audible when the signal is ultimately output via a speaker or the like. In any event, therefore, when connecting an audio signal, by way of example, through a low pass filter of a crossover to a speaker woofer, only the lower frequency signals pass unaffected to the woofer, while the remaining signals are eliminated and, thus, are not presented to the woofer.

Given the above, the present inventor endeavors in the preferred embodiments described later to implement low and high pass filters in a digital implementation, which if combined provide a digital crossover. Further, the preferred embodiment low and high pass filters have adjustable corner frequencies, thereby permitting a user or other input to effectively tune the extent to which the filter permits signals (either high or low frequency, based on the filter type) to pass through the filter. Such an approach is provided to address the complexities of the prior art, including reducing the complexity and cost of implementing such devices, while still providing an acceptable level of performance.

By way of further background, the present inventor along with other inventors previously described a digital implementation for a different type of filter than those of the present preferred embodiments, namely, the previous approach is directed to so-called shelving (or "shelf") filters; this description is provided in U.S. patent application Ser. No. 09/408,095, entitled "Digital Tone Control With Linear Step Coefficients," filed Sep. 27, 1999, assigned to Texas Instruments Incorporated, and hereby incorporated herein by reference. Indeed, Texas Instruments Incorporated also has commercially sold a device that includes a variable gain shelf filter identified as a TLC320AD81, TAS3001, TAS3002, TAS3004, TAS3103. The approach described in the referenced patent application, and also included in the commercial TLC320AD81, TAS3001, TAS3002, TAS3004, TAS3103 devices, provides numerous benefits for variable-gain shelf filters, and further in this regard the incorporated application and the TLC320AD81, TAS3001, TAS3002, TAS3004, TAS3103 devices achieve their results, in part, by applying piecewise linearization to the shelf filter coefficients while still permitting different filters, each with a different gain, to be applied to an audio signal. At this point, therefore, and by way of contrast, additional discussion is noteworthy with respect to the differences between the previously-described shelf filters, as may be contrasted to the high and low pass filters of the present preferred embodiments, where such filters were introduced above in connection with FIG. 1 and are further discussed below.

Shelf filters are so named because the response curve of such a filter typically includes two horizontal asymptotes, known as shelves. By way of example, FIG. 2 illustrates a frequency response $FR_3$ in the recognized shape for a shelf filter. Frequency response $FR_3$ has a corner frequency $CF_3$, which for consistency with the preceding examples is defined to occur at 3 dB below the upper horizontal asymptote of the filter; further, for a shelf filter, the upper asymptote also may referred to as a first shelf $SH_1$, where in the example illustrated shelf $SH_1$ occurs at 0 dB. Additionally, the shelf filter includes a lower horizontal asymptote that provides a second shelf $SH_2$, where in the example illustrated shelf $SH_2$ occurs at −11 dB. Note that typically in the prior art the dB difference between the upper and lower shelves of a shelf filter is on the order of 18 dB or less. At frequencies along the upper shelf $SH_1$, an audio signal input to the shelf filter is undisturbed, that is, a gain of 0 dB, translating to a value of 1, is applied to the input signal, thereby passing the input signal unaffected to the filter output. Conversely, at frequencies along the lower shelf $SH_2$, an audio signal input to the shelf filter is attenuated; in the example of FIG. 2, the attenuation is at a level of −11 dB.

Given the preceding and the skill in the art, various differences can be recognized as between prior art high/low pass filters (e.g., FIG. 1) and prior art shelf filters (e.g., FIG. 2). First, high/low pass filters are intended to completely eliminate a portion of the frequency band of their input signals following their corner frequency and toward their drop off to negative infinity, while shelf filters pass are typically not intended to eliminate any band of the input signal, rather, shelf filters often pass the entire input signal, albeit at two different levels, with the first level provided by one shelf (e.g., shelf $SH_1$ in FIG. 2) while only reducing the signal to a second level at the frequencies of the other shelf (e.g., shelf $SH_2$ in FIG. 2). In other words, for shelf filters, there is no passband or stopband since all frequencies are passed. The active region is where the boost or cut of the filter is applied, while the inactive region is where the signal is unaffected. Further, mathematics demonstrate that the two types of filters are quite distinct. By way of introduction, the generalized transfer function of both types of filters, as second order filters, may be represented by the following Equation 1, where the transfer function represents, in the time domain, the accumulation of samples at different delays $z^{-1}$ and $z^{-2}$:

$$H(z) = \frac{b_0 + b_1 z^{-1} + b_2 z^{-2}}{1 + a_1 z^{-1} + a_2 z^{-2}} \quad \text{Equation 1}$$

In Equation 1, therefore, five coefficients $b_0$, $b_1$, $b_2$, $a_1$, and $a_2$ are provided, and which once ascertained distinguish various filters from one another; moreover, note that the value "1" in the denominator is also sometimes referred to a sixth coefficient $a_0$, but for the sake of this document, that value can be maintained as equal to one. In any event, for sake of truly understanding a specific type of filter as well as its behavior, Equation 1, as a transfer function, merely defines in a broad sense the relationship of the filter's output with the filter's input, that is, the output equals the input times H(z). As such, Equation 1 is a very simplified representation of the effect provided by the five different filter coefficients, $a_1$, $a_2$, $b_0$, $b_1$, and $b_2$. To truly appreciate the difference between shelf filters and low/high pass filters, however, consider the following more precise mathematics as directed to the coefficients $a_1$, $a_2$, $b_0$, $b_1$, and $b_2$, with reference to those coefficients first for a shelf filter and then for a high or low pass filter.

By way of example to a shelf filter, consider the known bass-oriented shelf filter; its five coefficients according to the preceding are as shown in the following Equations 2 through 6:

$$b_0 = -\frac{-1 + 2a - 2\sigma g_n - 2g_n^2 a + 2\sigma g_n a^2 - a^2 - g_n^2 - g_n^2 a^2}{1 - 2a + 2\sigma g_d - 2\sigma g_d a^2 + 2g_d^2 a + a^2 + g_d^2 + g_d^2 a^2} \quad \text{Equation 2}$$

$$b_1 = -\frac{2 - 4a - 4g_n^2 a + 2a^2 - 2g_n^2 - 2g_n^2 a^2}{1 - 2a + 2\sigma g_d - 2\sigma g_d a^2 + 2g_d^2 a + a^2 + g_d^2 + g_d^2 a^2} \quad \text{Equation 3}$$

$$b_2 = \frac{1 - 2a - 2\sigma g_n + 2g_n^2 a + 2\sigma g_n a^2 + a^2 + g_n^2 + g_n^2 a^2}{1 - 2a + 2\sigma g_d - 2\sigma g_d a^2 + 2g_d^2 a + a^2 + g_d^2 + g_d^2 a^2} \quad \text{Equation 4}$$

$$a_1 = \frac{-2 + 4a + 4g_d^2 a - 2a^2 + 2g_d^2 + 2g_d^2 a^2}{1 - 2a + 2\sigma g_d - 2\sigma g_d a^2 + 2g_d^2 a + a^2 + g_d^2 + g_d^2 a^2} \quad \text{Equation 5}$$

-continued $$a_2 = \frac{1 - 2a - 2\sigma g_d + 2g_d^2 a + 2\sigma g_d a^2 + a^2 + g_d^2 + g_d^2 a^2}{1 - 2a + 2\sigma g_d - 2\sigma g_d a^2 + 2g_d^2 a + a^2 + g_d^2 + g_d^2 a^2}$$ Equation 6

Still further, for the known treble-oriented shelf filter; its five coefficients according to the preceding are as shown in the following Equations 7 through 11:

$$b_0 = \frac{1 + 2a + 2\sigma g_n - 2g_n^2 a - 2\sigma g_n a^2 + a^2 + g_n^2 + g_n^2 a^2}{1 + 2a + 2\sigma g_d - 2\sigma g_d a^2 - 2g_d^2 a + a^2 + g_d^2 + g_d^2 a^2}$$ Equation 7

$$b_1 = \frac{2 + 4a + 4g_n^2 a + 2a^2 - 2g_n^2 - 2g_n^2 a^2}{1 + 2a + 2\sigma g_d - 2\sigma g_d a^2 - 2g_d^2 a + a^2 + g_d^2 + g_d^2 a^2}$$ Equation 8

$$b_2 = \frac{1 + 2a - 2\sigma g_n - 2g_n^2 a + 2\sigma g_n a^2 + a^2 + g_n^2 + g_n^2 a^2}{1 + 2a + 2\sigma g_d - 2\sigma g_d a^2 - 2g_d^2 a + a^2 + g_d^2 + g_d^2 a^2}$$ Equation 9

$$a_1 = \frac{2 + 4a + 4g_d^2 a + 2a^2 - 2g_d^2 - 2g_d^2 a^2}{1 + 2a + 2\sigma g_d - 2\sigma g_d a^2 - 2g_d^2 a + a^2 + g_d^2 + g_d^2 a^2}$$ Equation 10

$$a_2 = \frac{1 + 2a - 2\sigma g_d - 2g_d^2 a + 2\sigma g_d a^2 + a^2 + g_d^2 + g_d^2 a^2}{1 + 2a + 2\sigma g_d - 2\sigma g_d a^2 - 2g_d^2 a + a^2 + g_d^2 + g_d^2 a^2}$$ Equation 11

Further, various of the variables in the preceding Equations 2 through 11 are further defined based on the gain of the filter, according to following Equations 12 through 14:

if gain≥0.5 and gain≤2, $F=\sqrt{g}$      Equation 12 if $gain \geq 1.0$ and $gain \leq 2$, $F = \dfrac{g}{\sqrt{2}}$      Equation 13 if gain<0.5 or gain>2, $F=g\sqrt{2}$      Equation 14

With the value of F from the appropriate one of Equations 12 through 14, then the remaining variables for the above, including those directed to gain, are as in the following Equations 15 through 20, based in response to the desired corner frequency, $f_c$, and the sampling frequency to be used in the system, $F_s$, where the latter is included because, as known in the art, digital filter coefficients are explicit functions of the system sampling frequency, that is, the actual frequency response—where the corner frequency occurs—will change when the sampling frequency changes.

$$g_d = \frac{F^2 - 1}{\sqrt[4]{g^2 - F^2}}$$ Equation 15

$$g_n = g_d \sqrt{g}$$ Equation 16

$$a = \tan\left(\pi\left(\frac{f_c}{F_s} - \frac{1}{4}\right)\right)$$ Equation 17

$$\sigma = \frac{\sqrt{2}}{2}$$ Equation 18

In contrast, however, consider now the coefficient definitions for either a high or low pass Linkwitz-Riley filters. For a low pass filter, and where $\omega_c$ is $2\pi$ times the corner frequency, $f_c$, the coefficients are as shown in the following Equations 19 through 23:

$$b_0 = \frac{\omega_c^2}{\omega_c^2 + k^2 + 2k\omega_c}$$ Equation 19

$$b_1 = \frac{2\omega_c^2}{\omega_c^2 + k^2 + 2k\omega_c}$$ Equation 20

$$b_2 = \frac{\omega_c^2}{\omega_c^2 + k^2 + 2k\omega_c}$$ Equation 21

$$a_1 = \frac{2\omega_c^2 - 2k^2}{\omega_c^2 + k^2 + 2k\omega_c}$$ Equation 22

$$a_2 = \frac{\omega_c^2 + k^2 - 2k\omega_c}{\omega_c^2 + k^2 + 2k\omega_c}$$ Equation 23

Further, for a high pass Linkwitz-Riley filters, the coefficients $a_1$ and $a_2$ are the same as shown in Equations 22 and 23 for a low pass filter, while the remaining coefficients $b_0$, $b_1$, and $b_2$ are as shown in the following Equations 24 through 26:

$$b_0 = \frac{k^2}{\omega_c^2 + k^2 + 2k\omega_c}$$ Equation 24

$$b_1 = \frac{-2k^2}{\omega_c^2 + k^2 + 2k\omega_c}$$ Equation 25

$$b_2 = \frac{k^2}{\omega_c^2 + k^2 + 2k\omega_c}$$ Equation 26

With the qualitative differences between shelf filters and high/low pass filters having been described above in connection with the contrast of FIGS. 1 and 2, one skilled in the art should also appreciate by contrasting Equations 2 through 18 with Equations 19 through 26 to further understand such differences. Having previously considered improving variable gain for shelf filters in the above-referenced U.S. patent application Ser. No. 09/408,095, various aspects of the preferred embodiments described below are not directed to filter gain or shelf filters, but instead are directed to adjusting the filter corner frequencies, and preferably adjusting those corner frequencies in high and low pass filters.

BRIEF SUMMARY OF THE INVENTION

In the preferred embodiment, there is a system for providing an integer number N of filters. The system comprises an input for receiving a digital audio signal and an output for providing a filtered audio signal. The system also comprises circuitry for storing at least a first set of fixed filter coefficients and circuitry for storing estimation data. The system also comprises circuitry for estimating a number of sets of estimated filter coefficients in response to the estimation data and the fixed filter coefficients. The system also comprises circuitry for applying a transfer function to the digital audio signal and in response for providing the filtered audio signal. The circuitry for applying the transfer function applies a set of filter coefficients selected from the first set of fixed filter coefficients and the sets of estimated filter coefficients. Also, the transfer function is selected from a transfer function set consisting of a high pass filter transfer function and a low pass filter transfer function.

Other aspects are also disclosed and claimed.

DETAILED DESCRIPTION OF THE INVENTION

Figure 1:
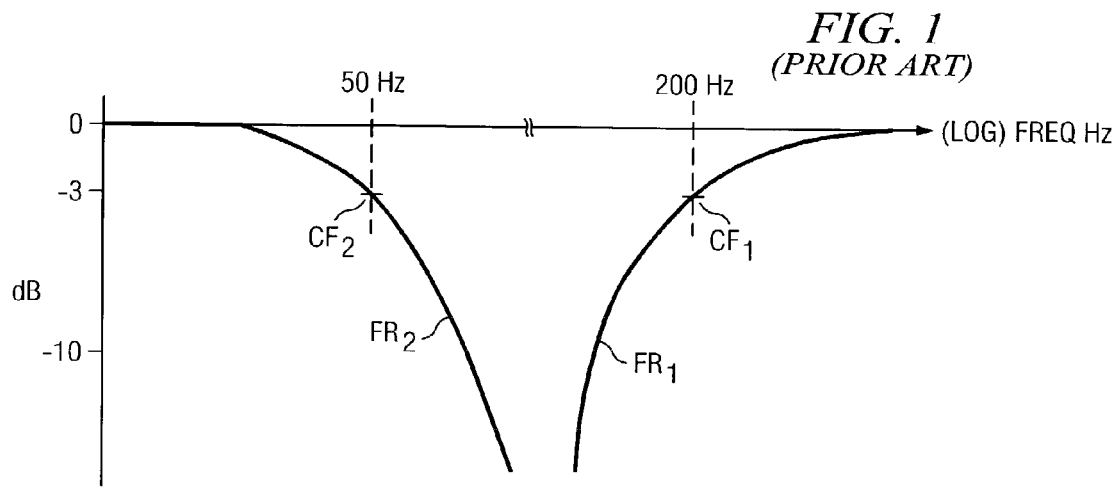
FIG. 1 illustrates a frequency response of a high pass filter and a frequency response of a low pass filter.
Figure 2:
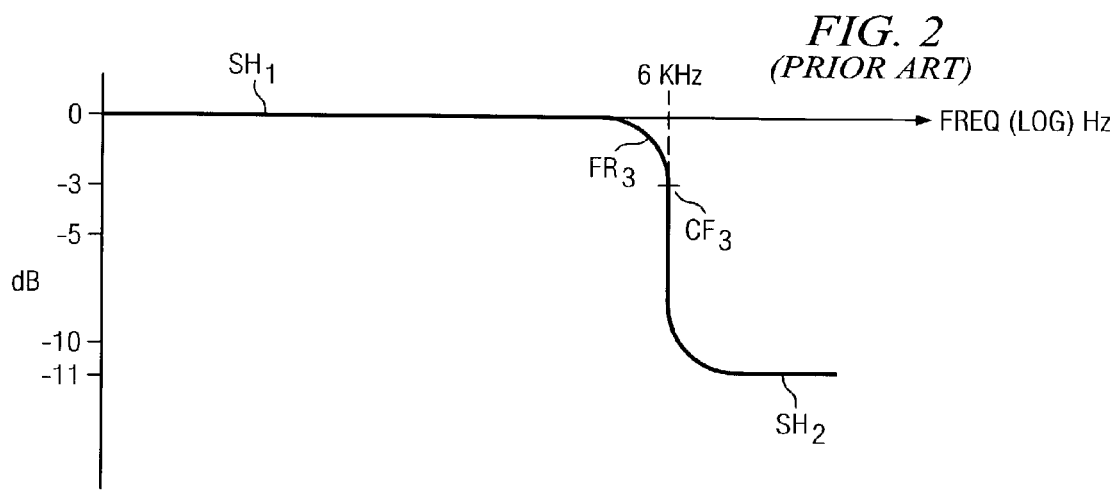
FIG. 2 illustrates a frequency response for a shelf filter.

FIGS. 1 and 2 were described earlier in connection with the Background Of The Invention section of this document, and the reader is assumed to be familiar with the principles in that description.

Figure 3:
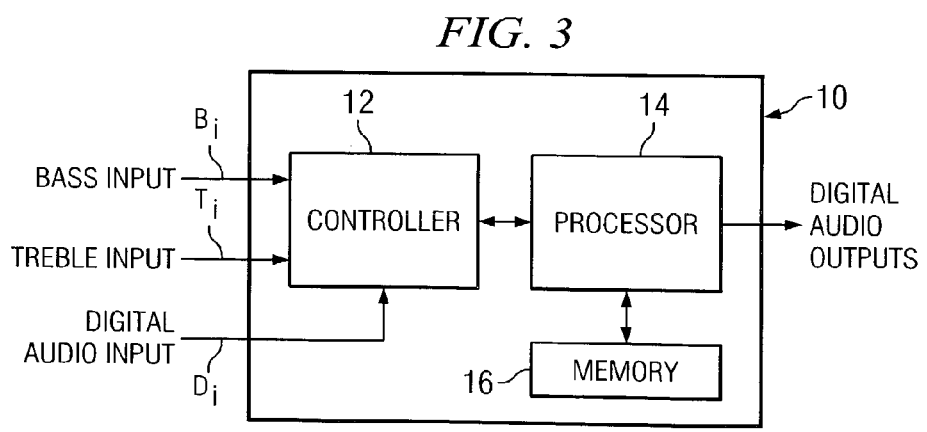
FIG. 3 illustrates a block diagram of an audio crossover processing system 10 in accordance with the preferred embodiments.

FIG. 3 illustrates a block diagram of an audio crossover processing system 10 in accordance with the preferred embodiments. System 10 includes three components, all of which may be constructed with combinations of hardware, firmware, and software where appropriate, according to principles known in the art, in order to accomplish the inventive overall functionality described in this document. Each of these components is first introduced separately below, with the remainder of this document further presenting the individual and overall functionality provided by those components. Moreover, note that all three components in one preferred embodiment are in the same integrated circuit, where memory 16 may be downloadable; in an alternative embodiment, controller 12 and processor 14 may be integrated into a single integrated circuit, with memory 16 provided as a an external and switchable/updateable memory.

System 10 includes a controller 12, sometimes also referred to as a microcontroller, for receiving a bass input $B_i$ and a treble input $T_i$, where these inputs may be provided from various sources. By way of example, in one preferred embodiment, two user-tunable devices (e.g., tuner, potentiometer, and so forth), either in analog or digital form, are provided wherein the user adjusts each device to provide a corresponding variable signal representative of the amount of bass and treble desired in the crossover functionality of system 10. The signal from each tunable device is either in digital form or is converted to digital form to provide the respective inputs $B_i$ and $T_i$. Controller 12 also receives a digital audio input $D_i$ that represents the signal to be filtered by crossover system 10, that is, such that the user-selectable low frequency portion of that signal is passed via a low pass filter and the user-selectable high frequency portion of that signal is passed via a high pass filter. Lastly, while not shown, controller 12 also may receive various other inputs to perform additional functionality outside the scope of this discussion. In any event, controller 12 coordinates its inputs and is operable to pass an indicator of each input to a processor 14, to which controller 12 is bi-directionally connected.

Processor 14 may take various forms, such as an application specific integrated circuit ("ASIC"), a microprocessor, or a tailored digital signal processor ("DSP") such as one of the various DSPs commercially available from Texas Instruments Incorporated. Processor 14 includes sufficient complexity and capability to provide real-time mathematic processing capability so as to sufficiently perform signal processing on the digital audio input signal $D_i$, and to correspondingly provide a digital audio output signal, $D_o$. The digital audio output signal $D_o$ then may be processed further by appropriate analog circuitry and then presented to one or more speakers (not shown), where the effect provided by crossover system 10 will be evident in the sound presented by the speaker(s) in that the bass and treble bands will have been separated in a manner consistent with the tuning as provided to system 10 in inputs $B_i$ and $T_i$, respectively.

By way of further introduction to some of the processing operations performed by processor 14 and to appreciate the results provided in the output signal $D_o$, note that processor 14 is also bi-directionally connected to a memory 16. Memory 16 may be constructed according to various principles known in the art in order to provide a device capable of storing digital information, where in the preferred embodiment such information includes the values of certain filter coefficients corresponding to the values described above in Equations 21 through 28. As also detailed later, memory 16 also stores offset values, where these offsets can be added or subtracted by processor 14 to the memory-stored filter coefficients so as to provide estimates of additional filter coefficients. In all events, however, note that memory construction principles often dictate reducing the size and capacity of such a memory. Indeed, as detailed later, note that the bit-precision of memory 16 may be less than that of processor 14. Indeed, such a limitation has arisen in prior art audio processing systems such as the above-described TLC320AD81, TAS3001, TAS3002, TAS3004, TAS3103 devices previously implemented and sold by Texas Instruments Incorporated. Such a limitation is common in that the cost to implement a memory is affected by various factors including storage and bit-precision capacity, product development cycle, and whether the memory capacity is already utilized or near-utilized by other demands. Thus, in instances where such a disparity occurs, the preferred embodiments also contemplate still additional functionality to improve performance notwithstanding this limitation.

Figure 4:
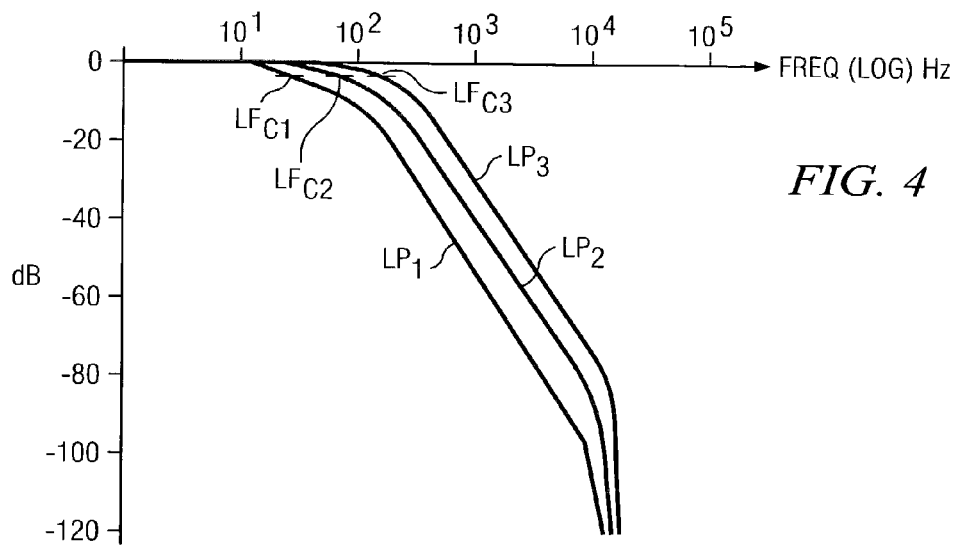
FIG. 4 illustrates frequency response plots for each of three different low pass filters as a simplified example.

The operation of system 10 is now described generally with additional detail provided later. Generally, system 10 is operable to filter the digital audio input $D_i$ via crossover filters, that is, using both low and high pass filters. Further, system 10 is such that for each of the low and high bands, a number of different low pass and high pass filters may be selected, where the filters differ from one another primarily in that they have different respective corner frequencies. To further demonstrate these aspects, FIG. 4 illustrates frequency response plots for each of three different low pass filters, represented by plots $LP_1$, $LP_2$, and $LP_3$, as a simplified example. In operation, bass input $B_i$ provides a signal representative of a filter with a certain low pass filter corner frequency, where again this signal may be set in response to a user action such as the tuning of a variable device or the like. For sake of reference, this filter with a selectable corner frequency is referred to as a target filter. For example, assume in a first instance that the user desires the listening characteristics provided by allowing only the lowest of frequencies to pass to the output of system 10. In this first instance, the user tunes signal $B_i$ to achieve a target filter having the plot $LP_1$, which filter is then imposed by system 10 on $D_i$. As a result, the output $D_o$ attenuates any frequency components in $D_i$ above the corner frequency, $LF_{c1}$, of plot $LP_1$. Continuing the example, assume in a second instance that the user desires the listening characteristics provided by allowing slightly more of the lowest of frequencies to pass to the output of system 10. In this second instance, the user tunes signal $B_i$ to achieve a different filter having the plot $LP_2$, which is then imposed by system 10 on $D_i$. As a result, the output $D_o$ attenuates any frequency components in $D_i$ above the corner frequency, $LF_{c2}$, of plot $LP_2$. As a final example, assume in a third instance that the user desires the listening characteristics provided by allowing still more of the lowest of frequencies to pass to the output of system 10. In this third instance, the user tunes signal $B_i$ to achieve a different target filter having the plot $LP_3$, which is then imposed by system 10 on $D_i$. As a result, the output $D_o$ attenuates any frequency components in $D_i$ above the corner frequency, $LF_{c3}$, of plot $LP_3$. Lastly, note that the plots described above as well as the high and low pass filters implemented in the preferred embodiment may be of various types of such filters, including without limitation Bessel, Butterworth, Linkwitz-Riley, Chebychev, and so forth. In the remaining discussion and in the preferred embodiments, assume then that the high and low pass filters are Linkwitz-Riley filters.

Given the previous discussion of FIG. 4 and the operation of system 10, some additional observations are noteworthy. First, FIG. 4 illustrates only the instance of three user-selectable low pass filters by way of a simplified example. In the preferred embodiment, system 10 actually incorporates a larger number of filters, where preferably there are 150 low pass filters, although a different number of filters may be provided in an alternative embodiment. Second, while FIG. 4 illustrates the case for low pass filters, system 10 performs a comparable high pass operation for high pass filters, although a separate plot need not be shown so as to not unduly complicate the discussion. In the comparable high pass operation, therefore, the preferred embodiment also includes 150 user-selectable high pass filters. Returning now to FIG. 3, the implementation of both the high and low pass filters is further explored. Specifically, as shown by Equations 21 through 28 in the Background Of The Invention section of this document, a single filter, whether low or high pass, may be implemented by deriving five coefficients for that filter, where those coefficients can then be applied to an audio signal using the transfer function of Equation 1. Toward this end, in the preferred embodiments, one set of five coefficients is stored in memory 16, and processor 14 then accesses those coefficients and processes $D_i$ based on the accessed coefficients to thereby apply one the 150 filters to the audio input signal, $D_i$. However, to implement a total of 150 low pass filters, then memory 116 would have to store 750 total coefficients (i.e., 150 filters*5 coefficients/filter=750 coefficients); further, to also accommodate 150 high pass filters, then memory 116 would have to store an additional 750 total coefficients, for a total of 1,500 coefficients to support all the desired filters. Such storage requirements necessarily would dictate a particular size for memory 116, but as an alternative in the preferred embodiments the amount of required storage is considerably reduced, as further detailed below.

The preferred embodiments implement an efficient manner of providing coefficients to provide for the total of 300 (or a different number) different high/low pass filters without the need for storing all 1,500 coefficients as described above. Instead, in the preferred embodiment, the five coefficients for less than all of the filters are stored, and then an estimation technique is employed by processor 14 to determine an estimation of the appropriate coefficients for the remaining filters for which predetermined coefficients are not stored, where the estimation is based in part on the stored coefficients. In the preferred embodiment, the implemented estimation technique is piecewise linearization, although possibly in alternative embodiments other techniques may be employed. Using piecewise linearization, then the preferred embodiment approach only one set of coefficients is stored for 1 of the 150 filters, and for each other filter its coefficients can be estimated based on the corner frequency offset between it and the stored set as well as in consideration of so-called breakpoints, where various of these details are further explored below.

Before reaching the preferred embodiment approach of piecewise linearization, each of FIGS. 5a, 6a, 7a, 8a, and 9a illustrates a plot of the values of the actual coefficients for 150 high pass filters, determined from Equations 24 through 28 above, for a high pass filter. Thus, each of these filters may have a response curve shape in a general form as that shown above as response $FR_1$ in FIG. 1, where each of the 150 different filters has a different respective corner frequency. Notably, each plot depicts that the low pass filter coefficient, plotted along the vertical axis, changes for different values of corner frequency, plotted along the horizontal axis. Further, note that each coefficient change in each plot is directed in the preferred embodiment toward a change of filter corner frequency, where this is in contrast to the above-incorporated U.S. patent application Ser. No. 09/408,095 wherein shelf filter coefficients are analyzed in terms of filter gain without regard to corner frequency. By way of example with reference to FIG. 5a, it illustrates a plot of the actual coefficient $b_0$ at a sample rate of 48 kHz, where each one of the 150 different values of $b_0$ therefore corresponds to a high pass filter with a different corner frequency. In the preferred embodiment, the entirety of the 150 filter coefficients in FIG. 5a corresponds to 150 respective filters, spanning a set of integer corner frequencies from 51 Hz to 200 Hz. Thus, filter number 1 occurs at 51 Hz, filter number 2 occurs at 52 Hz, and so forth through filter number 150 which occurs at 200 Hz. As examples of the actual coefficient, for a corner frequency of 51 Hz (i.e., filter number 1), then $b_00$=0.99335736849272, for a corner frequency of 101 Hz (i.e., filter number 50), then $b_00$=0.98690888966732, and for a corner frequency of 200 Hz (i.e., filter number 150), then $b_0$=0.97432383775182.

Figure 5A:
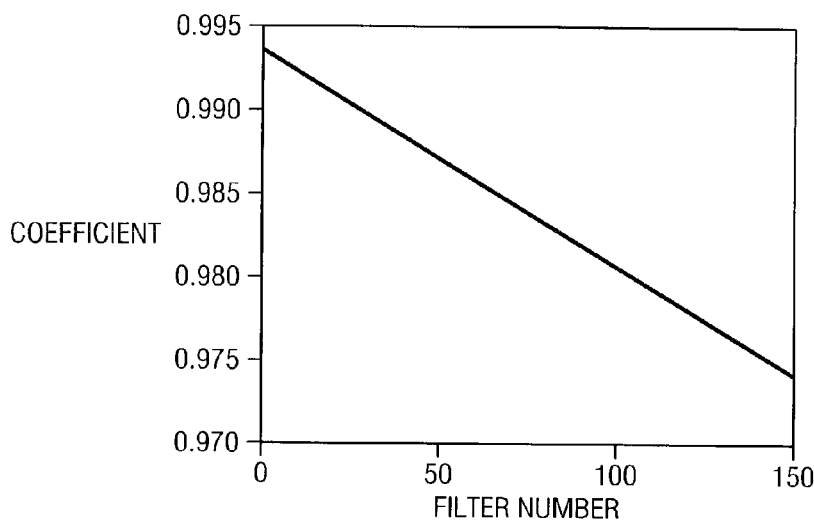
FIG. 5a illustrates a plot of the values of the actual coefficient $b_0$ for 150 high pass filters.
Figure 5B:
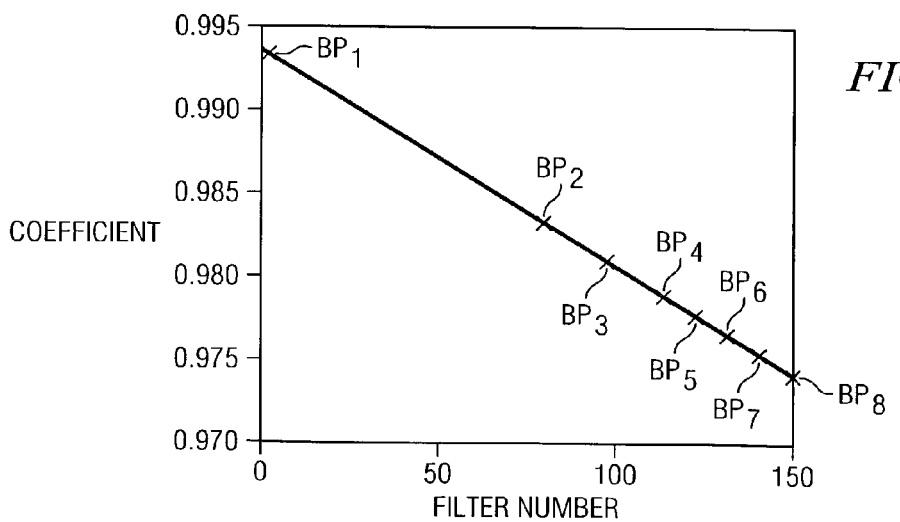
FIG. 5b illustrates a plot of the piecewise linear values of the estimated coefficient $b_0$ for 150 high pass filters.
Figure 6A:
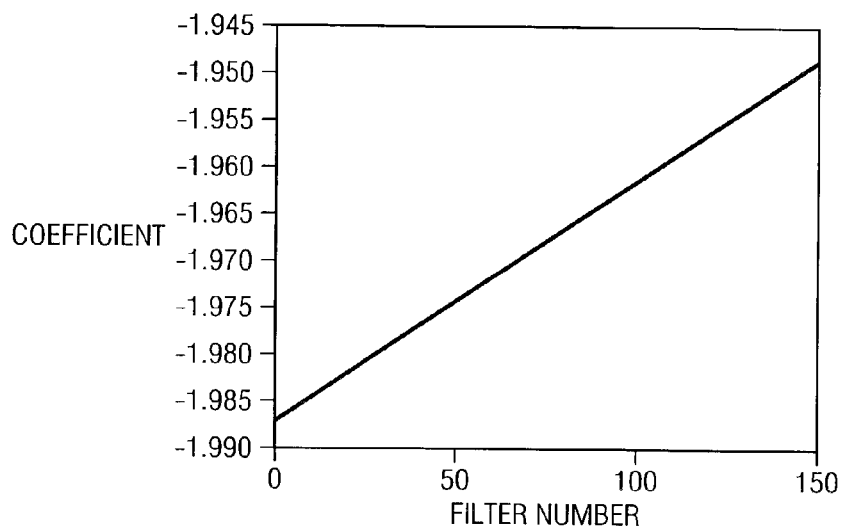
FIG. 6a illustrates a plot of the values of the actual coefficient $b_1$ for 150 high pass filters.
Figure 6B:
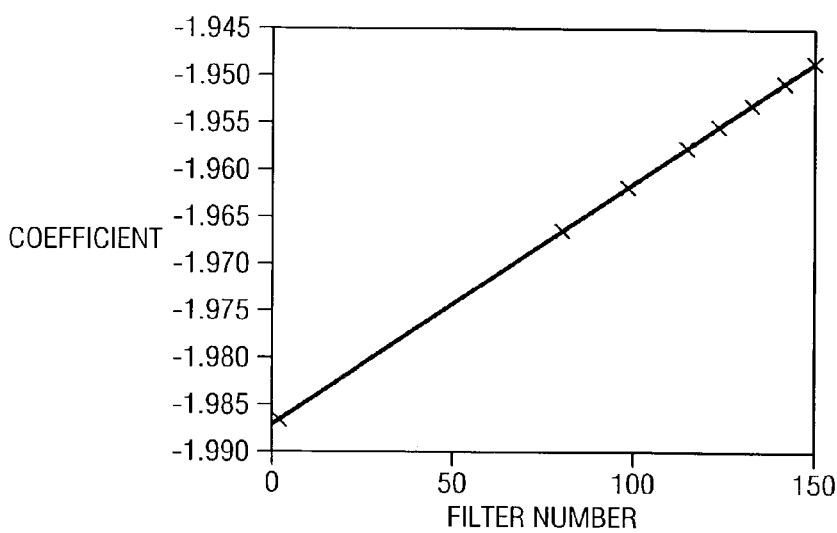
FIG. 6b illustrates a plot of the piecewise linear values of the estimated coefficient $b_1$ for 150 high pass filters.
Figure 7A:
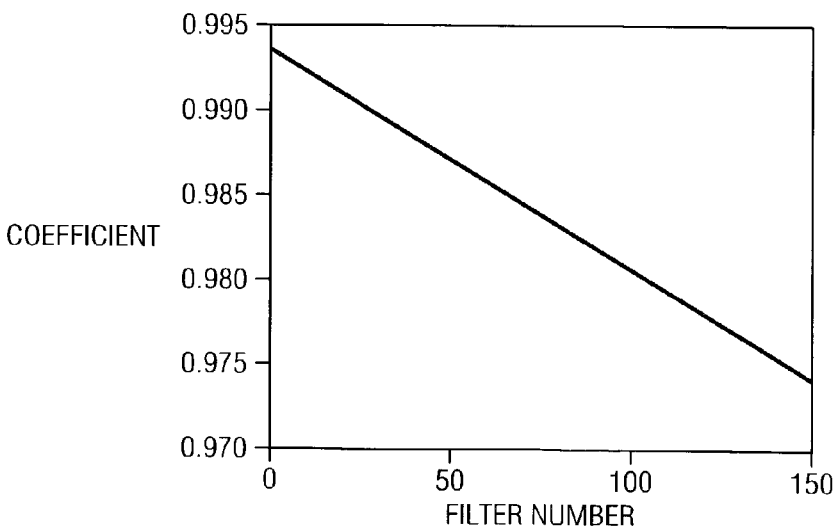
FIG. 7a illustrates a plot of the values of the actual coefficient $b_2$ for 150 high pass filters.
Figure 7B:
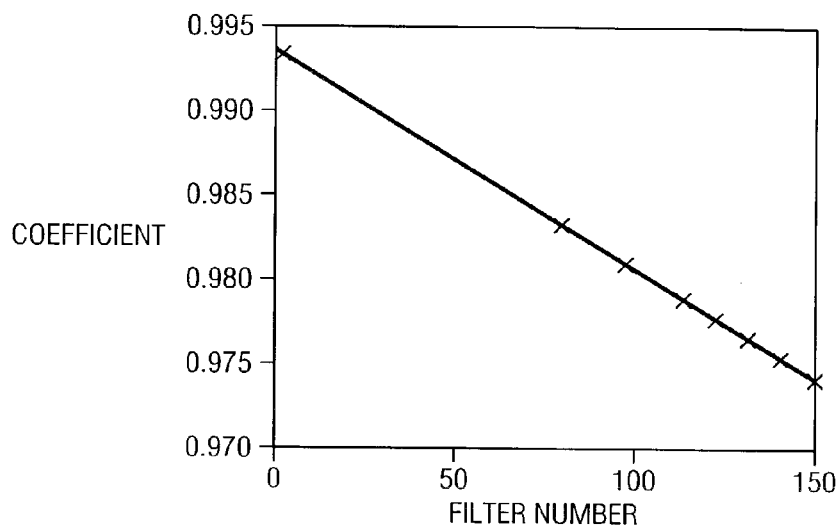
FIG. 7b illustrates a plot of the piecewise linear values of the estimated coefficient $b_2$ for 150 high pass filters.
Figure 8A:
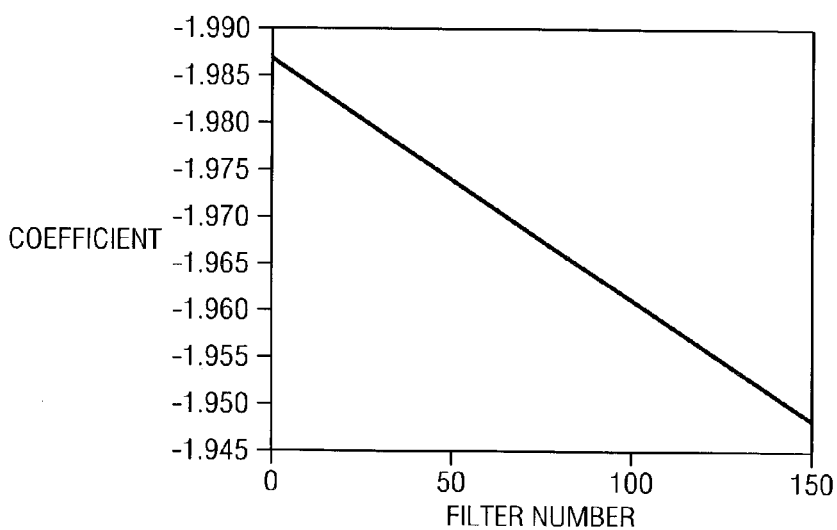
FIG. 8a illustrates a plot of the values of the actual coefficient $a_1$ for 150 high pass filters.
Figure 8B:
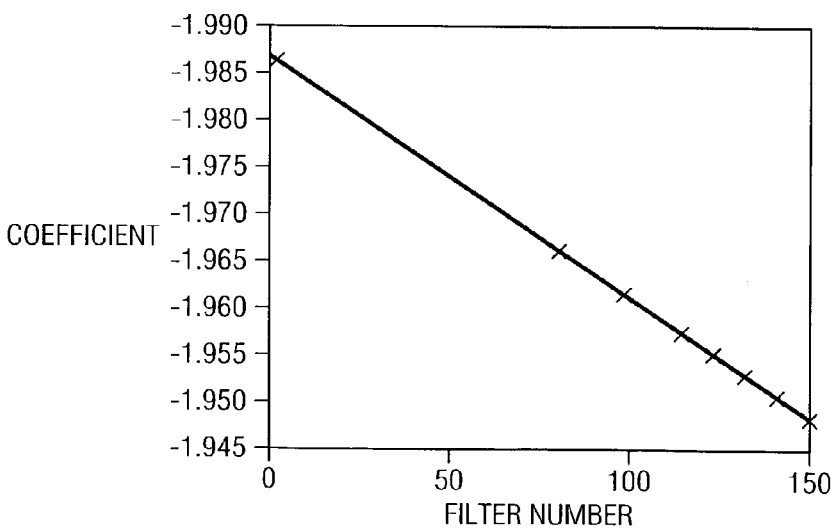
FIG. 8b illustrates a plot of the piecewise linear values of the estimated coefficient $a_1$ for 150 high pass filters.
Figure 9A:
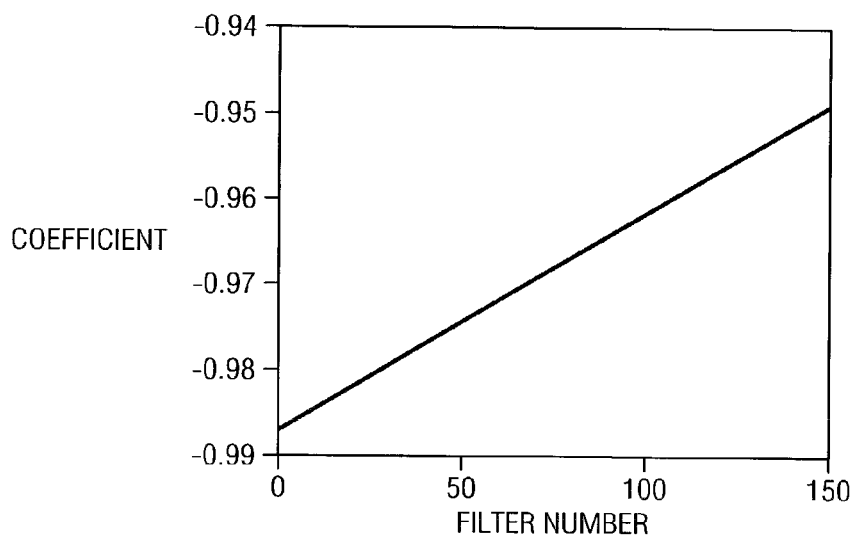
FIG. 9a illustrates a plot of the values of the actual coefficient $a_2$ for 150 high pass filters.
Figure 9B:
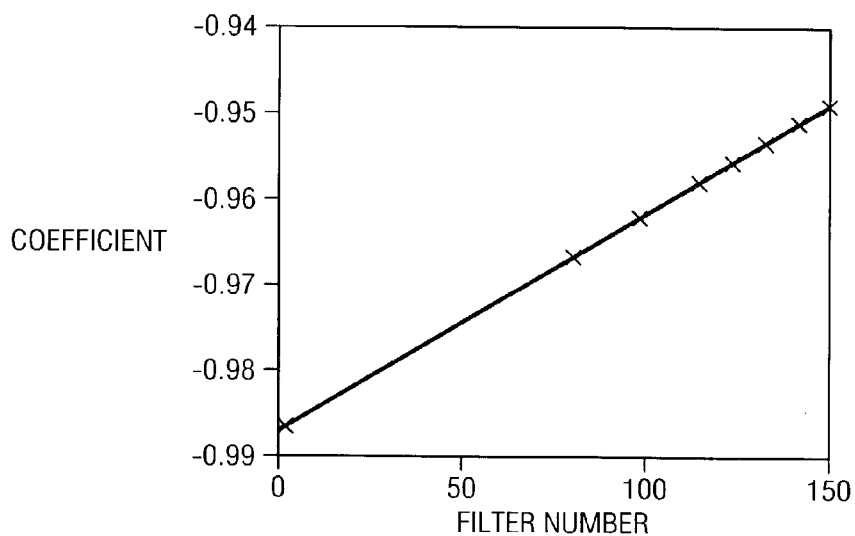
FIG. 9b illustrates a plot of the piecewise linear values of the estimated coefficient $a_2$ for 150 high pass filters.
Figure 10A:
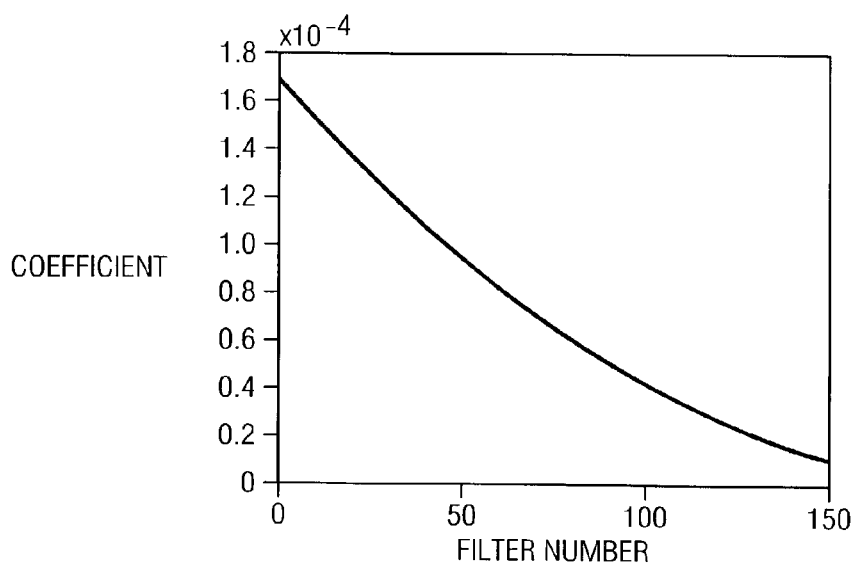
FIG. 10a illustrates a plot of the values of the actual coefficient $b_0$ for 150 low pass filters.
Figure 10B:
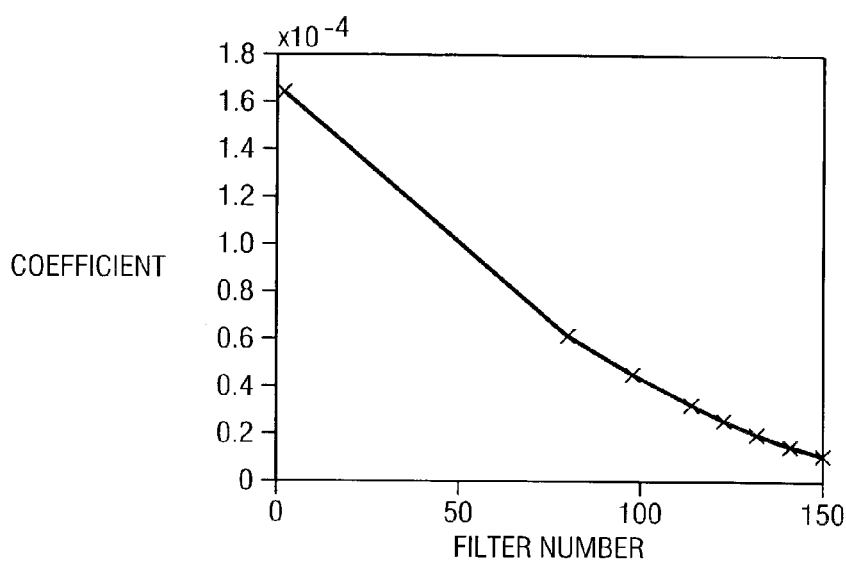
FIG. 10b illustrates a plot of the piecewise linear values of the estimated coefficient $b_{0\,for}$ 150 low pass filters.
Figure 11A:
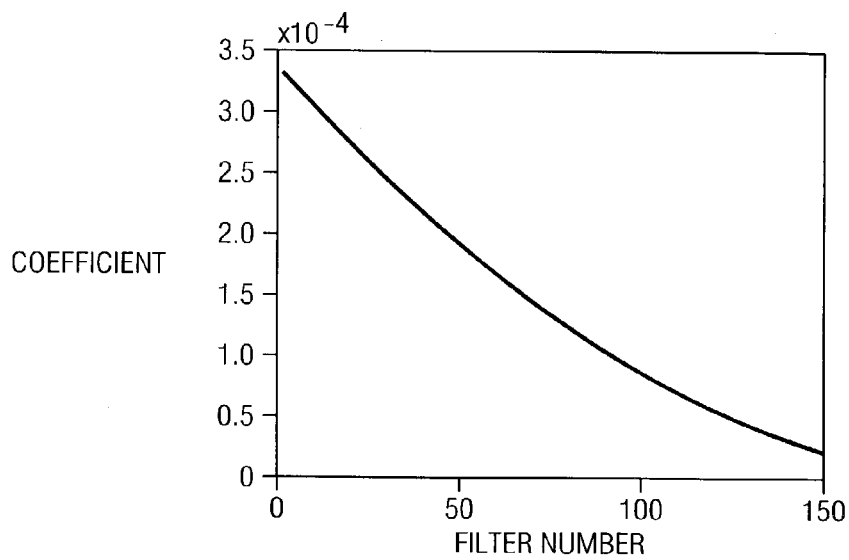
FIG. 11a illustrates a plot of the values of the actual coefficient $b_1$ for 150 low pass filters.
Figure 11B:
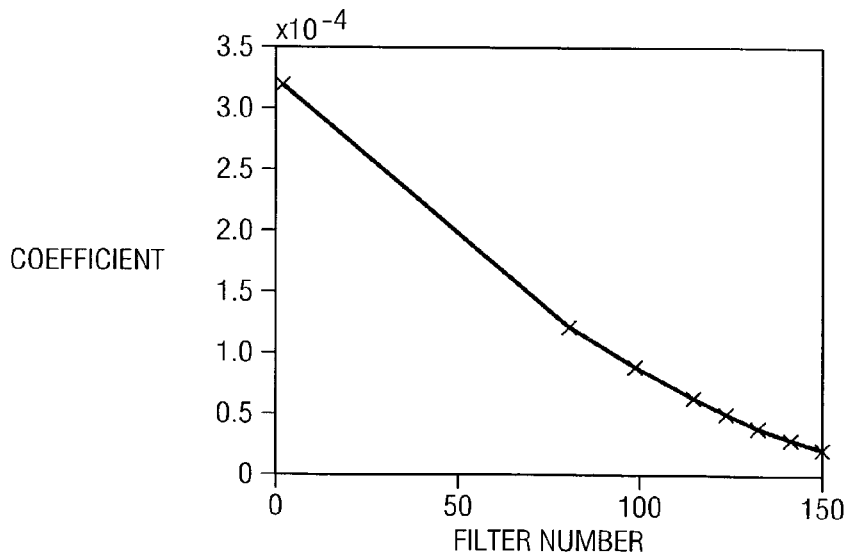
FIG. 11b illustrates a plot of the piecewise linear values of the estimated coefficient $b_1$ for 150 low pass filters.
Figure 12A:
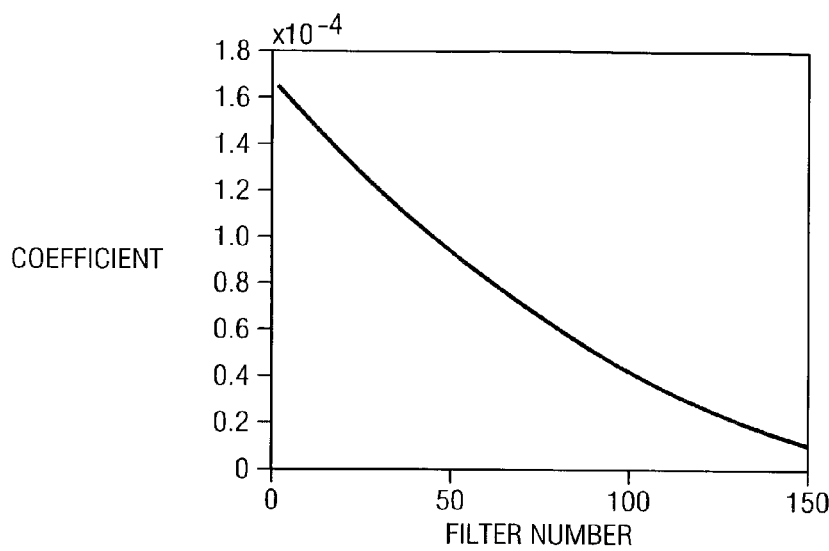
FIG. 12a illustrates a plot of the values of the actual coefficient $b_2$ for 150 low pass filters.
Figure 12B:
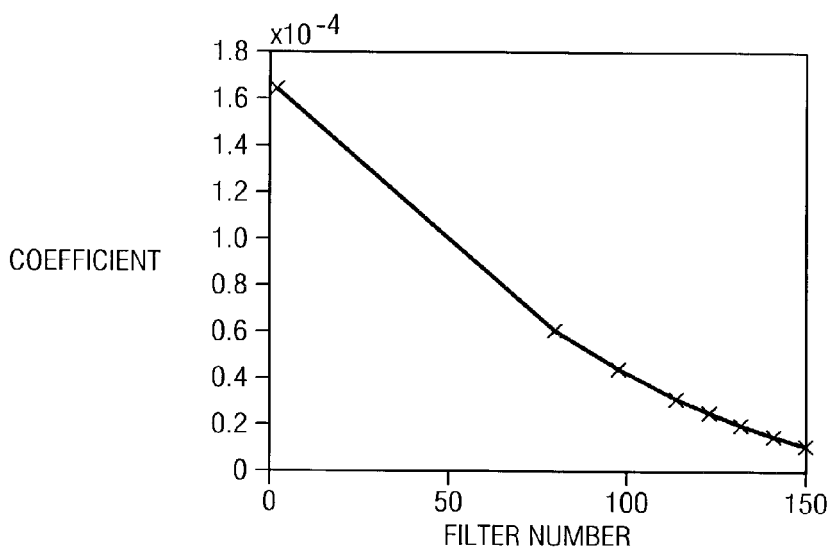
FIG. 12b illustrates a plot of the piecewise linear values of the estimated coefficient $b_2$ for 150 low pass filters.
Figure 13A:
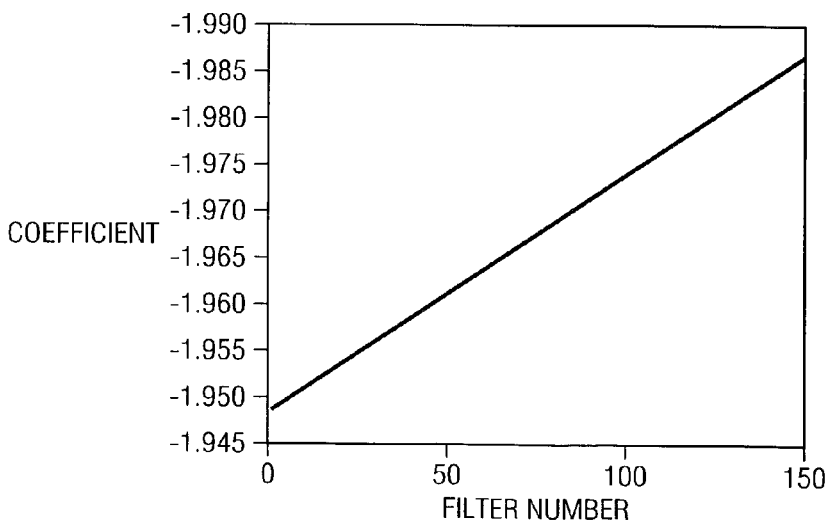
FIG. 13a illustrates a plot of the values of the actual coefficient $a_1$ for 150 low pass filters.
Figure 13B:
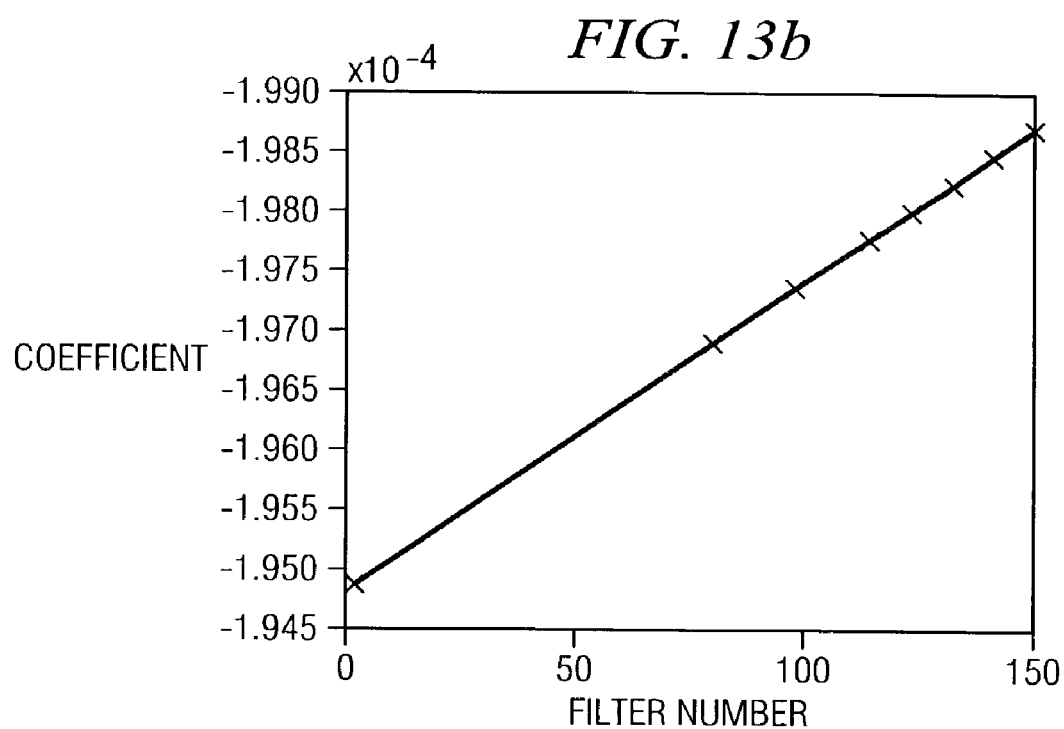
FIG. 13b illustrates a plot of the piecewise linear values of the estimated coefficient $a_1$ for 150 low pass filters.
Figure 14A:
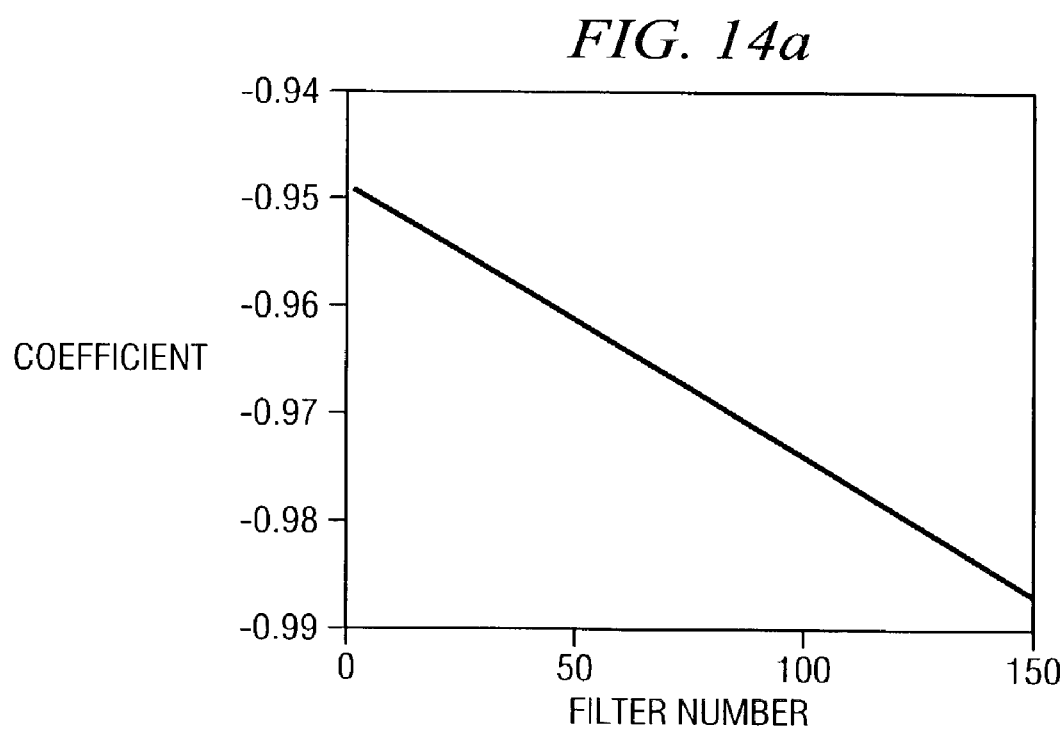
FIG. 14a illustrates a plot of the values of the actual coefficient $a_2$ for 150 low pass filters.
Figure 14B:
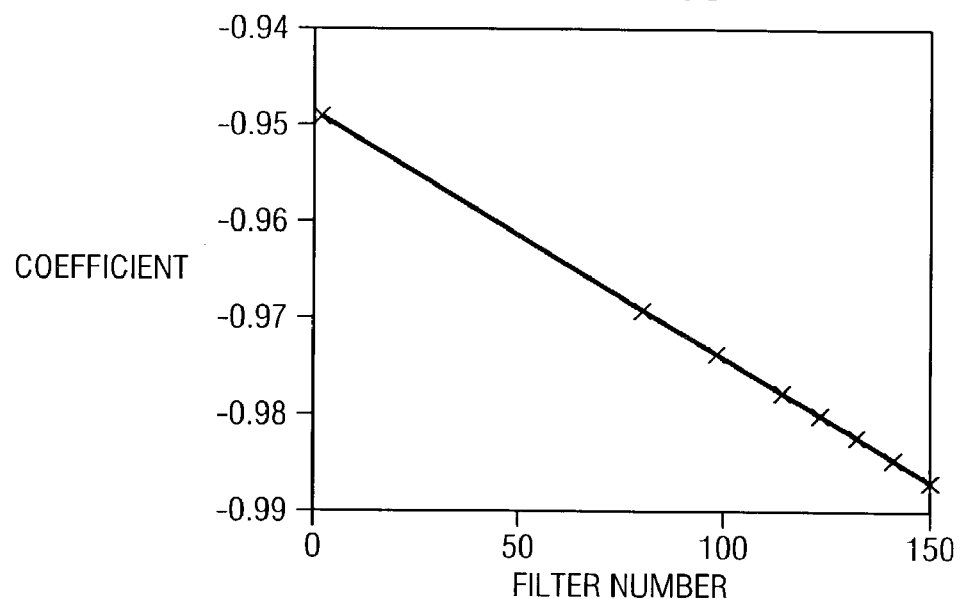
FIG. 14b illustrates a plot of the piecewise linear values of the estimated coefficient $a_2$ for 150 low pass filters.

As introduced above, according to the preferred embodiments, piecewise linearization is applied to each of the plots in FIGS. 5a, 6a, 7a, 8a, and 9a, where the results are plotted respectively in FIGS. 5b, 6b, 7b, 8b, and 9b, again using the example of a sample rate at 48 kHz. For example, looking to FIG. 5b, it is formed by taking the plot of $b_0$ from FIG. 5a and estimating it in the form of seven different linear regions. The endpoints of these regions are sometimes referred to in the piecewise linearization art as breakpoints, and the breakpoints are shown in FIG. 5b as $BP_1$ through $BP_8$. These breakpoints occur at filter number 1, 80, 98, 114, 123, 132, 141, and 150 (i.e., corresponding to frequencies at 51, 130, 148, 173, 182, 191, and 200 Hz, respectively). Also, for sake of reference, the linear region between each pair of breakpoints is referred to herein as a breakpoint range. Further, with the piecewise linearization, then by definition the linear slope in each breakpoint range (i.e., between breakpoints) dictates that there is a same offset value between each successive coefficient located at any unit frequency distance from another coefficient along the same piecewise line. Indeed, with respect to FIGS. 5b, 6b, 7b, 8b, and 9b, the following Table 1 identifies the hexadecimal ("HEX") offsets of each of the five coefficients for each line between each pair of breakpoints.

Given the piecewise linearization in FIGS. 5b, 6b, 7b, 8b, and 9b, and as therefore reflected in the values of Table 1, according to the preferred embodiment only the five actual coefficients, $b_0$, $b_1$, $b_2$, $a_1$, $a_2$, for one of the 150 filters are stored in memory 16, as are the offsets and breakpoints in Table 1, and from this information processor 14 determines estimated coefficients for any of the other 149 high pass filters. Specifically, in the preferred embodiment, the five actual coefficients for the high pass filter located at a predetermined frequency of 164 Hz are stored in memory 116, although these values could be predetermined for a different baseline frequency. Specifically, these five values are as shown, in hexadecimal format, in the following Table 2:

TABLE 2

| Coefficient | Actual HEX value |
| --- | --- |
| $b_0$ | 07D4BB0F2D |
| $b_1$ | F05689E1A6 |
| $b_2$ | 07D4BB0F2D |
| $a_1$ | 0FA8FFD9F3 |
| $a_2$ | F856139D3E |

Continuing with the example of a baseline frequency of 164 Hz, if a user provides a treble input $T_i$ that corresponds to a target filter with a corner frequency at 164 Hz, then the actual coefficients of Table 2 are used by processor 14, in accordance with Equation 1, to process $D_i$ and thereby provide the low frequency filtered signal at $D_o$.

If a user provides a treble input $T_i$ that corresponds to a desired high pass filter at a frequency other than the baseline frequency, that is, the one for which the actual coefficients are stored (e.g., 164 Hz), then processor 14 determines an estimated set of five coefficients for that filter by either adding or subtracting offsets using the information from the piecewise linearization Table 1 relative to each of the stored five coefficients for the baseline 164 Hz filter and also relative to the then-selected filter. Various examples of this operation are provided below.

As an example of the operation of processor 14 to determine estimated coefficients for a desired filter, assume that a newly-adjusted $T_i$ corresponds to a target high pass filter between the same breakpoints as the current setting of

TABLE 1

| Between breakpoints | $b_0$ | $b_1$ | $b_2$ | $a_1$ | $a_2$ |
| --- | --- | --- | --- | --- | --- |
| $B_1$ and $B_2$ (51–130 Hz) | 0000436D64 | FFFF792538 | 0000436D64 | 000087A70B | FFFF79F17A |
| $B_2$ and $B_3$ (130–148 Hz) | 0000436D64 | FFFF792538 | 0000436D64 | 000086CE40 | FFFF7B9FFF |
| $B_3$ and $B_4$ (148–164 Hz) | 0000436D64 | FFFF792538 | 0000436D64 | 0000868301 | FFFF7C3512 |
| $B_4$ and $B_5$ (164–173 Hz) | 0000436D64 | FFFF792538 | 0000436D64 | 0000864BE1 | FFFF7CA22D |
| $B_5$ and $B_6$ (173–182 Hz) | 0000436D64 | FFFF792538 | 0000436D64 | 000086244E | FFFF7CF072 |
| $B_6$ and $B_7$ (182–191 Hz) | 0000436D64 | FFFF792538 | 0000436D64 | 000085FCD3 | FFFF7D3E7E |
| $B_7$ and $B_8$ (191–200 Hz) | 0000436D64 | FFFF792538 | 0000436D64 | 000085D570 | FFFF7D8C4F |

A few examples also further demonstrate the values in Table 1. As a first example, for a filter number between breakpoints $B_1$ and $B_2$, its coefficient $b_0$ is HEX 0000436D64 different from the filter number either immediately before or after it, and also in the $B_1$-to-$B_2$ breakpoint range. As another example, for a filter number between breakpoints $B_7$ and $B_8$, its coefficient $a_2$ is HEX FFFF7D8C4F different from the filter number either immediately before or after it, and also in the $B_7$-to-$B_8$ breakpoint range.

$T_i$. For example, assume that system 10 is presently set for a high pass filter with a corner frequency at the baseline value of 164 Hz, and assume further that $T_i$ is adjusted to indicate a target high pass filter with a corner frequency equal to 165 Hz. First, processor 14 determines the breakpoint range of the present filter with a corner frequency of 164 Hz, which from Table 1 is the breakpoint range between breakpoint $B_4$ at 164 Hz and breakpoint $B_5$ at 173 Hz. Next, processor 14 adjusts the then-existing five filter coefficients, corresponding to the 164 Hz filter, each by the respective Table 1 offset in the $B_4$-to-$B_5$ range, until it reaches the estimated coefficients for the filter corresponding to the target specified by $T_i$. In the present example and for coefficient $b_0$, then from Table 1 the coefficient offset for each integer frequency in the breakpoint range between breakpoints $B_4$ and $B_5$ is HEX 0000436D64. Accordingly, processor 14 subtracts this offset from the 164 Hz $b_0$ filter value of HEX 07D4BB0F2D with the result providing an estimate of $b_0$ corresponding to the target high pass filter with a corner frequency at 165 Hz. Similarly, processor 14 makes such an adjustment with respect to the other four coefficients, $b_1$, $b_2$, $a_1$, and $a_2$. Thus, for $b_1$, processor 14 once subtracts the $B_4$-to-$B_5$ offset for $b_1$=HEX FFFF792538 from the value of HEX F05689E1A6, with the result providing an estimate of $b_1$ corresponding to the target high pass filter with a corner frequency at 165 Hz; also in this case, note that the offset of HEX FFFF792538 is a negative number, so the subtraction of it results in a net addition, which should be appreciated by one skilled in the art as desirable given the positive slope of $b_1$ in FIG. 6*b*. The remaining adjustments corresponding to each of $b_2$, $a_1$, and $a_2$ are performed in a manner comparable to that for $b_0$ and $b_1$ and, therefore, should now be readily apparent to one skilled in the art.

As another example of the operation of processor 14 to determine estimated coefficients for a target filter, assume that a newly-adjusted $T_i$ corresponds to a target high pass filter in a different breakpoint range as the current setting of $T_i$. For specific numbers of such an example, after the adjustment in the immediately-preceding example of estimating the coefficients for a high pass filter having a corner frequency at 165 Hz, assume now that $T_i$ is adjusted to correspond to target a high pass filter having a corner frequency at 190 Hz. In such a case and by way of introduction, note that the present filter with a corner frequency at 165 Hz is between breakpoints $B_4$ and $B_5$, while the target filter with a corner frequency at 190 Hz is between breakpoints $B_6$ and $B_7$. In this case and under the preferred embodiments, processor 14 proceeds generally as described above, but the adjustment of the then-existing five filter coefficients passes through each coefficient, corresponding to a respective integer frequency, from 165 Hz to 190 Hz, using the respective offsets from Table 1. In other words, for each integer frequency adjustment, which in this example includes 165 Hz, 166 Hz, 167 Hz, . . . , 190 Hz, processor 14 determines the appropriate offset for the then-provided coefficients, and this continues until the target of five coefficients for a filter having a corner frequency of 190 Hz is reached.

Applying the above principles in the present example, initially each of the five coefficients correspond to a frequency of 165 Hz, and from Table 1 the coefficient offset for that frequency occurs between breakpoints $B_4$ and $B_5$; for example, for $b_0$, that offset equals HEX 0000436D64. Thus, at 165 Hz, the then-existing value of $b_0$ is adjusted by subtracting from it the offset of HEX 0000436D64, thereby providing a value of $b_0$ corresponding to a filter having a corner frequency of 166 Hz, and this process is also performed for the other four coefficients $b_1$, $b_2$, $a_1$, and $a_2$ (where again, the subtraction will be of a negative number for $b_1$ and $a_2$). This process repeats for a total of eight instances of the same offsets, thereby reaching a set of five coefficients corresponding to a high pass filter with a corner frequency at breakpoint $B_5$, equal to 173 Hz. Once $b_0$ corresponding to the corner frequency at the $B_5$ breakpoint frequency of 173 Hz is obtained, note that the very next adjustment could be either using the offset from the $B_4$-to-$B_5$ range or the $B_5$-to-$B_6$ range, since both ranges include 173 Hz as a breakpoint. However, in the preferred embodiment, processor 14 once more uses the offset value from the $B_4$-to-$B_5$ region in Table 1, that is, in the preferred embodiment when the filter number is being increased, then the offset used for the adjustment is the same as that used in the breakpoint range used for the immediately-preceding adjustment. Thus, at this point in the example, since the current filter has its corner frequency at the breakpoint of 173 Hz, then the same $B_4$-to-$B_5$ offset of HEX 0000436D64 is used once more, that it, it is subtracted from the result provided by the previous eight subtractions. At this point in the example, therefore, an estimate of $b_0$ is provided for a high pass filter having a corner frequency of 174 Hz, and similar adjustments, using respective offsets, are made for the other four filter coefficients. As an aside, note further in the preferred embodiment that in the opposite situation, wherein the filter number is being decreased, then the offset used for the adjustment is the that corresponding to the filter that will result after the immediate adjustment, so, by way of example, if the coefficients are for a filter at 148 Hz and there is an adjustment to a filter at 147 Hz, then the offsets for the breakpoint range for the 147 Hz filter (i.e., $B_2$-to-$B_3$) are used. In any event, returning to the above example and continuing toward a destination of 190 Hz in the present example, processor 14 proceeds as described above, by first identifying the proper offset for each coefficient of the then-present filter. At this point, the filter has a frequency corner at 174 Hz, which note is in the $B_5$-to-$B_6$ breakpoint range. Accordingly, for the present adjustment and from Table 1, the offset for the new breakpoint range is used for each coefficient; for example, for $b_0$, which is now in the $B_5$-to-$B_6$ breakpoint range, the offset equals HEX 0000436D64. Thus, the present adjustment to $b_0$ is made by subtracting HEX 0000436D64 from the present value of $b_0$, thereby yielding an estimate of $b_0$ for a high pass filter having a corner frequency at 175 Hz, with similar adjustments again made for the other coefficients and their respective offsets in the $B_5$-to-$B_6$ breakpoint range. One skilled in the art will appreciate that this process will continue from 174 Hz to 182 Hz, at which time an additional breakpoint range is encountered. Thus, for the high pass filter with a corner frequency at 182 Hz, it is adjusted one last time according to the respective offsets in the $B_5$-to-$B_6$ breakpoint range, thereby yielding estimated coefficients for a high pass filter with a corner frequency at 183 Hz. In the next seven adjustments, therefore, the coefficients are in the $B_6$-to-$B_7$ breakpoint range, thereby causing processor 14 to make those adjustments according to the offsets in that latter range. At the completion of the seventh adjustment, therefore, processor 14 will have determined the entire set of five estimated coefficients for the target high pass filter having a corner frequency of 190 Hz.

In another aspect of the preferred embodiments, processor 14 performs the above-described adjustments at a preferred rate so as not to cause any strong audible signals that might arise if the filters were switched too quickly. Toward this end, preferably processor 14 operates such that, for each single adjustment in a set of filter coefficients, the signal $D_i$ is sampled numerous times with a corresponding output $D_o$ for that set. In other words, during the adjustments in the preceding example, a number of samples of $D_i$ are processed for $b_0$, $b_1$, $b_2$, $a_1$, $a_2$ corresponding to a filter with a corner frequency at 165 Hz, then next a number of samples of $D_i$ are processed for $b_0$, $b_1$, $b_2$, $a_1$, $a_2$ corresponding to a filter with a corner frequency at 166 Hz, then next a number of samples of $D_i$ are processed for $b_0$, $b_1$, $b_2$, $a_1$, $a_2$ corresponding to a filter with a corner frequency at 167 Hz, and so forth up to the final desired frequency of 190 Hz. The number of samples of: $D_i$, and corresponding outputs of $D_o$, may be adjusted by one skilled in the art based on various factors, including the sample rate of the system. By way of example, for a sampling rate of 48 kHz, then preferably processor 14 filters 64 samples for each set of coefficients, as those coefficients are adjusted from a first setting of $T_i$ toward a target setting provided by $T_j$.

In the preferred embodiment, system 10 also implements a group of 150 low pass filters in a comparable manner to that described above for the 150 high pass filters. Thus, each of these filters may have a response curve shape in a general form as that shown above as response $FR_2$ in FIG. 1, where each of the 150 different filters has a different respective corner frequency. Given the considerable detail above, one skilled in the art should therefore appreciate the following without an extensive repeat of the previous discussion. In the preferred embodiment, the 150 low pass filters have respective corner frequencies starting at an integer frequency of 199 Hz and down to 50 Hz. The actual plots of the coefficients $b_0$, $b_1$, $b_2$, $a_1$, and $a_2$ for such filters are shown in FIGS. 10a, 11a, 12a, 13a, and 14a, respectively, while the piecewise linearized plots for those coefficients are shown in FIGS. 10b, 11b, 12b, 13b, and 14b, respectively, where in each of these plots once more the sample rate of 48 kHz is used. In the case of the these low pass filters, the five actual coefficients for a single filter at 87 Hz are stored in memory 116 in hexadecimal format, although these values could be predetermined for a different baseline frequency. In any event, the five actual coefficients for a single filter at 87 Hz, and as stored in memory 116, are as shown in the following Table 3:

TABLE 3

| Coefficient | Actual HEX value |
|---|---|
| $b_0$ | 00000836 |
| $b_1$ | 0000106C |
| $b_2$ | 00000836 |
| $a_1$ | 07E912DE |
| $a_2$ | FC16CC49 |

Also in the preferred embodiment, for the low pass filters, the same filter numbers as used for the high pass filter breakpoints are used for the low pass filter breakpoints, namely, filter numbers 1, 80, 98, 114, 123, 132, 141, and 150; in an alternative embodiment, different breakpoints could be ascertained if desired. In any event, here those numbers correspond to different frequencies because the range is shifted from 199 Hz down to 50 Hz and, thus, the different breakpoints correspond to the integer frequencies of 50, 129, 147, 172, 181, 190, and 199 Hz, respectively.

Moreover, from the piecewise linearized plots of FIGS. 10b, 11b, 12b, 13b, and 14b, the HEX offsets between these breakpoints can be determined, as shown in the following Table 4:

TABLE 4

| Between breakpoints | $b_0$ | $b_1$ | $b_2$ | $a_1$ | $a_2$ |
|---|---|---|---|---|---|
| $B_1$ and $B_2$ (50–129 Hz) | 00000058 | 000000B1 | 00000058 | FFFFBCC7 | 000041D6 |
| $B_2$ and $B_3$ (129–147 Hz) | 0000003E | 0000007C | 0000003E | FFFFBC5B | 000042AB |
| $B_3$ and $B_4$ (147–163 Hz) | 00000035 | 0000006A | 00000035 | FFFFBC35 | 000042F7 |
| $B_4$ and $B_5$ (163–172 Hz) | 0000002E | 0000005C | 0000002E | FFFFBC19 | 0000432F |
| $B_5$ and $B_6$ (172–181 Hz) | 00000029 | 00000052 | 00000029 | FFFFBC05 | 00004357 |
| $B_6$ and $B_7$ (181–190 Hz) | 00000024 | 00000048 | 00000024 | FFFFBBF0 | 0000437F |
| $B_7$ and $B_8$ (190–199 Hz) | 0000001F | 0000003E | 0000001F | FFFFBBDC | 000043A8 |

With the information from Tables 3 and 4 stored in memory 16, processor 14 operates to tune to a low pass filter in response to $B_j$, in a comparable manner as described above for the tuning to a high pas filter in response to $T_j$.

Figure 15:
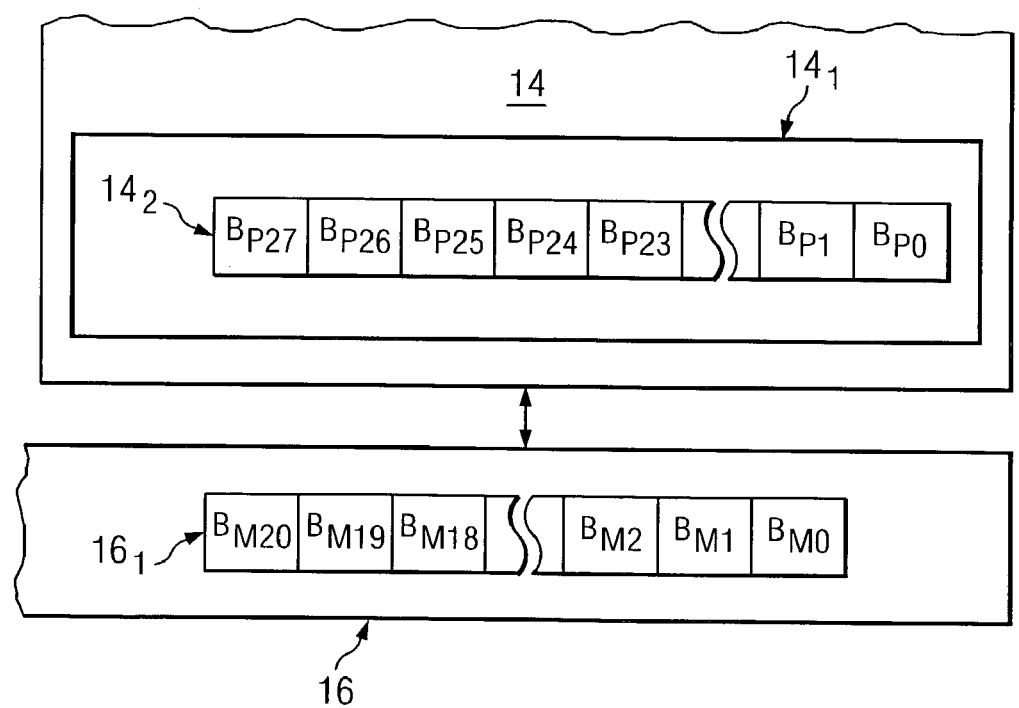
FIG. 15 illustrates only a portion of each of processor 14 and memory 16 of FIG. 3 to demonstrate the relative bit precision of the two devices in one embodiment.

FIG. 15 illustrates another aspect that may be incorporated into the preferred embodiments, and arises in connection with processor 14 and memory 16 introduced earlier with respect to FIG. 3. Specifically, FIG. 15 illustrates only a small portion of each of these two devices so as to address additional aspects, while one skilled in the art should appreciate that both processor 14 and memory 16 include additional circuitry that is not shown. FIG. 15 depicts that processor 14 includes an arithmetic logic unit ("ALU") $14_1$, and that ALU includes some type of functional unit $14_2$ for purposes of accomplishing certain ALU functions, which may include by ways of example addition, subtraction, and bit-shifting. By way of example, functional unit $14_2$ in FIG. 15 has a capacity to operate on a total of 28 bits at a time, shown from least to most significant bits as $B_{P0}$ through $B_{P27}$. FIG. 15 also depicts that memory 16 includes a storage unit $16_1$, where it is contemplated that actually memory 16 includes a number of such storage units $16_x$, but only one is shown to simplify the illustration. In the preferred embodiment, each storage unit $16_x$ is for storing a number of bits, where each unit may be used to store either an offset value from Tables 1 and 4 above, or one of the known coefficients from Tables 2 and 3, above. Importantly for purposes of appreciating the additional aspects below, however, note that storage unit $16_x$ (and the other storage units $16_x$) has a capacity to store 21 bits at a time, shown from least to most significant bits as $B_{M0}$ through $B_{M20}$, and note also therefore that the bit capacity of each storage unit $16_x$ is less than the bit capacity of functional unit $14_2$. This relatively smaller bit capacity is possible, if not likely, in various implementations for audio processing devices, such as where various design considerations caused the memory (e.g., memory 16) to be as small as possible, and where such size reduction may be at the expense of bit precision in the memory as compared to the processing ALU.

In the context of an architecture such as shown in FIG. 15, the present inventor has further recognized that a filter implemented by such a system may have its performance affected due to the relatively smaller bit capacity of each storage unit $16_x$. For example, assume that functional unit $14_2$ is a fixed-point arithmetic unit, with five bits for storing and operating on an integer and the remaining 23 bits for storing and operating on a fraction. In contrast, assume that a memory storage unit $16_x$ is to store a fraction to be operated on by functional unit $14_2$, and assume that storage unit $16_x$ can store only up to a total of 21 bits. In other words, the capacity for processing a fraction is larger in ALU $14_1$ than it is in each memory unit $16_x$. Given this constraint, system 10 can be implemented by storing any offset value of Tables 1 and 4 into each such memory unit $16_x$, by truncating any bits beyond the 21 most significant bits ("MSBs") of any binary representation of a fractional offset. While such an approach may prove useful in some implementations, in another aspect of the preferred embodiments, performance may be improved further to address the limitation of reduced memory capacity as compared to the functional unit capacity, as further detailed below.

Recall that system 10 operates such that each newly-determined coefficient for a filter is determined by adding (or subtracting, which is adding of a negative number) an offset to a present coefficient. Thus, letting $\Delta$ generally indicate an offset, then in general each new coefficient, $C_n$, can be stated in terms of the present coefficient $C_p$ and the offset $\Delta$, as shown in the following Equation 29:

$$C_n = C_p + \Delta \qquad \text{Equation 29}$$

For example, for a present value of $b_0$, the value of $b_0$ at the next successive filter number is $b_0+\Delta$, and so forth for the other four coefficients $b_1$, $b_2$, $a_1$, and $a_2$. However, the present inventor has recognized two additional attributes of this determination. First, each offset value $\Delta$ in Tables 1 and 4 tends to be a relatively small number since it represents the difference between numbers of similar magnitude; in other words, looking at the piecewise linearization in the earlier Figures, the change in each coefficient between successive filter numbers is relatively small. Second, without further adjustment, each of these small numbers can only be stored in a form using the 21 bits in a storage unit $16_x$. Since these numbers are small, however, it is likely that many of the more significant stored bits will have a binary value of 0, and further that by truncating the offset value $\Delta$ to fit within 21 bits in a storage unit $16_x$, additional meaningful bits may be lost beyond the 21 stored bits.

To further improve performance in view of the preceding observations with respect to the limited storage in each storage unit $16_x$, in an alternative preferred embodiment, each offset value $\Delta$ is, in effect, shifted to the left a number of positions, SH, prior to storing it in memory 16. For example, assume that 23 bits [$B_{22}$:$B_0$] of a given offset value $\Delta$ may be as shown in the following Table 5:

the present inventor has determined that such bits can be used to improve performance by first implementing a left shift of SH bits. In the present example, let SH=2; as such, then the 23-bit offset value $\Delta$ of Table 5 becomes a 21-bit offset value $\Delta$ of the following Table 6, having bits [$B'_{20}$: $B'_0$].

TABLE 6

| $B'_{20}$ | $B'_{19}$ | $B'_{18}$ | $B'_{17}$ | $B'_{16}$ | $B'_{15}$ | $B'_{14}$ | $B'_{13}$ | $B'_{12}$ | $B'_{10}$ | $B'_9$ | $B'_8$ | $B'_7$ | $B'_6$ | $B'_5$ | $B'_4$ | $B'_3$ | $B'_2$ | $B'_1$ | $B'_0$ |
|---|---|---|---|---|---|---|---|---|---|---|---|---|---|---|---|---|---|---|---|
| 0 | 0 | 0 | 0 | 1 | 1 | 0 | 1 | 0 | 1 | 1 | 0 | 0 | 0 | 1 | 1 | 0 | 0 | 1 | 1 |

By shifting the offset value $\Delta$ in this manner, note that the two final bits $B_1$ and $B_0$ from Table 5, which otherwise would be truncated if $\Delta$ were stored in a storage unit $16_x$, are instead retained in the value of $\Delta'$ in Table 6, and it is this Table 6 value $\Delta'$ in the preferred embodiment that is stored in a storage unit $16_x$. Thereafter, and since processor 14 has a sufficient fractional precision (e.g., 23 bits), then in the preferred embodiment, after processor 14 reads the 21-bit offset value $\Delta'$ from a storage unit $16_x$, then first it reverses the shift operation to return to the original offset value $\Delta$ of the Table 5; in the present example, therefore, processor 14 reads the 21-bit Table 6 offset value, $\Delta$, from a storage unit $16_x$, and then processor 14 reverses the shift operation by right shifting by the value by SH, where in the present example SH=2. As a result, the returned value is that shown in Table 5, providing a 23-bit fractional number. As an aside, note that processor 14 may perform this operation in functional unit $14_2$ or in a separate functional unit, such as one dedicated to shifting operations. Further, note that SH may be fixed for all coefficient determinations, or in alternative embodiments it may be different for different offsets, where one skilled in the art may implement various manners of indicating to processor 14 the appropriate value(s) of SH so that processor 14 may then reverse that shifting in order to recapture the original offset value, $\Delta$.

Once processor 14 has reversed the shifting as described above and thusly returned the original offset value, $\Delta$, then in the preferred embodiment processor 14 determines the appropriate coefficient corresponding to the offset value, as provided by Equation 29. Note, therefore, that in this approach the result, $C_n$, of Equation 29, will include the greater precision of 23 fractional bits as compared the 21 fractional bits that would have been obtained by merely truncating the original offset value, $\Delta$, and using those truncated bits to determine $C_n$. Indeed, the present inventor has confirmed that greater filter performance may be

TABLE 5

| $B_{22}$ | $B_{21}$ | $B_{20}$ | $B_{19}$ | $B_{18}$ | $B_{17}$ | $B_{16}$ | $B_{15}$ | $B_{14}$ | $B_{13}$ | $B_{12}$ | $B_{10}$ | $B_9$ | $B_8$ | $B_7$ | $B_6$ | $B_5$ | $B_4$ | $B_3$ | $B_2$ | $B_1$ | $B_0$ |
|---|---|---|---|---|---|---|---|---|---|---|---|---|---|---|---|---|---|---|---|---|---|
| 0 | 0 | 0 | 0 | 0 | 0 | 1 | 1 | 0 | 1 | 0 | 1 | 1 | 0 | 0 | 0 | 1 | 1 | 0 | 0 | 1 | 1 |

Without the presently-described performance improvement, then the 21 MSBs of the value from Table 5 would be stored in a storage unit $16_x$, thereby truncating bits $B_1$ and $B_0$. However, in the example those truncated bits have non-zero values and, hence, they provide some meaningful data, albeit for lesser significant bit positions. Nonetheless, achieved using the additional embodiment described in connection with Table 6, particularly at the lowest audible frequencies that are passed by a low pass filter according to the preferred embodiments.

In still another alternative embodiment, the same memory size limitation illustrated in FIG. 15 also is recognized to have potential effect, not only on the offset values of Tables 1 and 4, but also on the storage of the coefficients of Tables 2 and 3. Specifically, recalling that Tables 2 and 3 store the actual values for the coefficients of one low pass filter and one high pass filter, the present inventor has further recognized that these coefficients, particularly for a low pass filter, also may be very small numbers. As such, these numbers are susceptible to a comparable loss of precision as described above with respect to the offset values, that is, when storing such a coefficient in a memory storage unit $16_x$ that has lower precision than the functional unit $14_2$ and thereby also truncating the coefficient to fit within the storage unit $16_x$, and when thereafter using that functional unit $14_2$ to perform an arithmetic operation with respect to the stored value, then some of the precision with respect to the least significant bits of the functional unit $14_2$ is lost. Accordingly, the preferred embodiments also contemplate an alternative to realize additional precision in this regard, as described below.

In one embodiment, the coefficients of Tables 2 and 3, or at least the coefficients $b_x$ (i.e., the numerator coefficients from Equation 1) of Table 3 as directed to a low pass filter, are also shifted to the left a number equal to the same shift parameter SH mentioned above with respect to the shift of the offset values as shown by example in Table 6. Thus, instead of storing each fixed coefficient $C_f$ in a storage unit $16_x$, instead that coefficient is shifted left SH times and a corresponding value, $C'_f$, is stored. In this case, however, note that both the coefficient and the offset values have been shifted to the same extent. Accordingly, thereafter, processor 14 can read both the coefficient and the corresponding offset value, and without any shifting, its functional unit $14_2$ can immediately add or subtract those values per Equation 29 because they have been shifted to the same extent. Moreover, as known in the art, a left shift is the same as multiplying a number times 2 raised to the power of the number of shits, and so by shifting both the coefficient and the offset left by SH, then algebraically both numbers have been multiplied times $2^{SH}$ and each individually shifted value then may be added or subtracted from one another; once the sum of the two is reached, then the result may be effectively divided by $2^{SH}$, that is, right shifted by SH, thereby returning the actual result of the sum/difference of the two that would occur prior to any shifting, and the result can be used in Equation 1 to realize the filter. Further, if the target filter number has not yet been reached, then the result may be maintained in processor 14 and the next left-shifted offset can be added to or subtracted from that result, continuing in this manner until the coefficients for the target filter number are obtained. Once they are so obtained, the result is right shifted by SH, and the right-shifted coefficient can be used in Equation 1 to realize the filter. Also, note that included within each such right-shifted coefficient is the additional precision obtained by previously including the left shifted values, because those values provided greater precision as compared to values that are truncated prior to determining the sum/difference that provides the next set of coefficients. Indeed, the present inventor also has confirmed that greater filter performance may be achieved by shifting both the offset and coefficients in this manner, such as by way of example through a shift of SH=4.

From the above, it may be appreciated that the above embodiments provide variable digital high and low pass filter, as may be implemented together in a variable digital crossover with numerous advantages over the prior art, where various of those advantages have been discussed above while still others will be ascertainable by one skilled in the art. Further, as another advantage, various alternatives have been provided that thereby present various combinations that may be included in alternative preferred embodiments and still others may be implemented. For example, while the preferred embodiments contemplate both a low and high pass filter incorporated into a crossover, the various inventive teachings can be included in solely one or the other of a high and a low pass filters. As another example, while the preferred embodiment stores only a single set of actual coefficients and uses estimation techniques to derive all other coefficients, more than one set of coefficients may be stored and estimation techniques may be made from any of the stored sets of coefficient. As still another example, while the preferred embodiments derive the estimated coefficients by stepping through each filter number between an original filter number and the target filter number, the jump toward the target filter may be in some resolution greater than every filter number between the original and target filter, and still further the jump may be the same or a different size in a same embodiment. As yet another example, while additional performance has been shown above by using left-shifted values when the bit capacity of the memory is less than that of the processor, in embodiments where most significant bits are represented to the right of data quantity then right shifting would be implemented. Lastly, while the preferred embodiments have shown an example of 150 filters, any number of filters may be achieved using the inventive teachings. Thus, these examples provide yet another basis from which one skilled in the art may ascertain yet other variations, and indeed while the present embodiments have been described in detail, various substitutions, modifications or alterations could be made to the descriptions set forth above without departing from the inventive scope which is defined by the following claims.

The invention claimed is:

1. A system for providing an integer number N of filters, comprising:
    an input for receiving a digital audio signal;
    an output for providing a filtered audio signal;
    circuitry for storing at least a first set of fixed filter coefficients;
    circuitry for storing estimation data;
    circuitry for estimating a number of sets of estimated filter coefficients in response to the estimation data and the fixed filter coefficients;
    circuitry for applying a transfer function to the digital audio signal and in response for providing the filtered audio signal;
    wherein the circuitry for applying the transfer function applies a set of filter coefficients selected from the first set of fixed filter coefficients and the sets of estimated filter coefficients; and
    wherein the transfer function is selected from a transfer function set consisting of a high pass filter transfer function and a low pass filter transfer function.

2. The system of claim 1 wherein the circuitry for storing stores only a single set of fixed filter coefficients corresponding to the high pass filter transfer function.

3. The system of claim 2 wherein the circuitry for storing estimation data comprises circuitry for storing piecewise linear estimation data.

4. The system of claim 1 wherein the circuitry for storing stores only a single set of fixed filter coefficients corresponding to the low pass filter transfer function.

5. The system of claim 4 wherein the circuitry for storing estimation data comprises circuitry for storing piecewise linear estimation data.

6. The system of claim 1:
wherein the circuitry for storing stores only a single set of fixed filter coefficients corresponding to the high pass filter transfer function; and
wherein the circuitry for storing stores only a single set of fixed filter coefficients corresponding to the low pass filter transfer function.

7. The system of claim 6 wherein the circuitry for storing estimation data comprises circuitry for storing piecewise linear estimation data.

8. The system of claim 1 wherein the circuitry for storing estimation data comprises circuitry for storing piecewise linear estimation data.

9. The system of claim 8:
wherein each filter of the integer number N of filters has a corresponding set of C actual filter coefficients;
wherein the piecewise linear estimation data comprises a plurality of piecewise linear ranges; and
wherein each range of the plurality of piecewise linear ranges provides a linear estimation of one of the C actual filter coefficients as the one of the C actual filter coefficients changes over a span of M of the integer number N of filters, wherein M is less than N.

10. The system of claim 9 and further comprising a user-controlled input, wherein the circuitry for applying the transfer function applies a set of filter coefficients selected in response to the user-controlled input.

11. The system of claim 1:
wherein the circuitry for storing estimation data comprises a memory having a plurality of storage units;
wherein each storage unit of the plurality of storage units has a bit storage capacity; and
wherein the circuitry for applying a transfer function has a fractional bit capacity greater than the bit storage capacity.

12. The system of claim 11:
wherein the estimation data comprises a plurality of modified offset values; and
wherein each modified offset value of the plurality of modified offset values represents a binary shifted offset value that is shifted in a first direction prior to being stored in the circuitry for storing estimation data.

13. The system of claim 12 and further comprising:
circuitry for reading a modified offset value for use by the circuitry for applying a transfer function; and
circuitry for shifting the read modified offset value in a second direction, opposite the first direction, prior to use by the circuitry for applying a transfer function.

14. The system of claim 13 wherein the first direction corresponds to a left shift and the second direction corresponds to a right shift.

15. The system of claim 13 wherein the first direction corresponds to a right shift and the second direction corresponds to a left shift.

16. The system of claim 12 wherein each fixed filter coefficient in the first set of fixed filter coefficients represents a binary shifted coefficient that is shifted in a first direction prior to being stored in the circuitry for storing at least a first set of fixed filter coefficients.

17. The system of claim 16 wherein the circuitry for estimating a number of sets of estimated filter coefficients in response to the estimation data comprises circuitry for adding a binary shifted offset value to a binary shifted coefficient.

18. The system of claim 16 wherein the circuitry for estimating a number of sets of estimated filter coefficients in response to the estimation data comprises circuitry for adding a binary left shifted offset value to a binary left shifted coefficient.

19. The system of claim 16 wherein the circuitry for estimating a number of sets of estimated filter coefficients in response to the estimation data comprises circuitry for adding a binary right shifted offset value to a binary right shifted coefficient.

20. The system of claim 1 wherein the filters are selected from a set consisting of Bessel, Butterworth, Linkwitz-Riley, and Chebychev filters.

21. The system of claim 1 and further comprising a user-controlled input, wherein the circuitry for applying the transfer function applies a set of filter coefficients selected in response to the user-controlled input.

22. A system for providing an integer number N of filters, comprising:
an input for receiving a digital audio signal;
an output for providing a filtered audio signal;
circuitry for storing at least a first set of fixed filter coefficients;
circuitry for storing piecewise linear estimation data;
circuitry for estimating a number of sets of estimated filter coefficients in response to the estimation data and the fixed filter coefficients;
circuitry for applying a transfer function to the digital audio signal and in response for providing the filtered audio signal;
wherein the circuitry for applying the transfer function applies a set of filter coefficients selected from the first set of fixed filter coefficients and the sets of estimated filter coefficients;
wherein the transfer function is selected from a transfer function set consisting of a high pass filter transfer function and a low pass filter transfer function;
wherein the circuitry for storing estimation data comprises a memory having a plurality of storage units;
wherein each storage unit of the plurality of storage units has a bit storage capacity; and
wherein the circuitry for applying a transfer function has a fractional bit capacity greater than the bit storage capacity.

23. The system of claim 22:
wherein the estimation data comprises a plurality of modified offset values; and
wherein each modified offset value of the plurality of modified offset values represents a binary shifted offset value that is shifted in a first direction prior to being stored in the circuitry for storing estimation data.

24. The system of claim 23 and further comprising:
circuitry for reading a modified offset value for use by the circuitry for applying a transfer function; and
circuitry for shifting the read modified offset value in a second direction, opposite the first direction, prior to use by the circuitry for applying a transfer function.

25. The system of claim 24 wherein the first direction corresponds to a left shift and the second direction corresponds to a right shift.

26. The system of claim 24 wherein the first direction corresponds to a right shift and the second direction corresponds to a left shift.

27. The system of claim 23 wherein each fixed filter coefficient in the first set of fixed filter coefficients represents a binary shifted coefficient that is shifted in a first direction prior to being stored in the circuitry for storing at least a first set of fixed filter coefficients.

28. The system of claim 27 wherein the circuitry for estimating a number of sets of estimated filter coefficients in response to the estimation data comprises circuitry for adding a binary shifted offset value to a binary shifted coefficient.

29. The system of claim 27 wherein the circuitry for estimating a number of sets of estimated filter coefficients in response to the estimation data comprises circuitry for adding a binary left shifted offset value to a binary left shifted coefficient.

30. The system of claim 27 wherein the circuitry for estimating a number of sets of estimated filter coefficients in response to the estimation data comprises circuitry for adding a binary right shifted offset value to a binary right shifted coefficient.

31. A method of operating a circuit for providing a filtered audio signal, comprising:
receiving a digital audio signal;
storing at least a first set of fixed filter coefficients;
storing estimation data;
estimating a number of sets of estimated filter coefficients in response to the estimation data and the fixed filter coefficients;
applying a transfer function to the digital audio signal and in response providing the filtered audio signal;
wherein the applying step applies a set of filter coefficients selected from the first set of fixed filter coefficients and the sets of estimated filter coefficients; and
wherein the transfer function is selected from a transfer function set consisting of a high pass filter transfer function and a low pass filter transfer function.

32. The method of claim 31 wherein the step of storing stores only a single set of fixed filter coefficients corresponding to the high pass filter transfer function.

33. The method of claim 32 wherein the step of storing estimation data comprises storing piecewise linear estimation data.

34. The method of claim 31 wherein the step of storing stores only a single set of fixed filter coefficients corresponding to the low pass filter transfer function.

35. The method of claim 34 wherein the step of storing estimation data comprises storing piecewise linear estimation data.

36. The system of claim 31:
wherein the step of storing stores only a single set of fixed filter coefficients corresponding to the high pass filter transfer function; and
wherein the step of storing stores only a single set of fixed filter coefficients corresponding to the low pass filter transfer function.

37. The method of claim 31 wherein the step of storing estimation data comprises storing piecewise linear estimation data.

38. The method of claim 37:
wherein the piecewise estimation data corresponds to an integer number N of filters;
wherein each of the integer number N of filters has a corresponding set of C actual filter coefficients;
wherein the piecewise linear estimation data comprises a plurality of piecewise linear ranges; and
wherein each range of the plurality of piecewise linear ranges provides a linear estimation of one of the C actual filter coefficients as the one of the C actual filter coefficients changes over a span of M of the integer number N of filters, wherein M is less than N.

39. The method of claim 38 and further comprising receiving a signal in response to a user-controlled input, wherein the step of applying the transfer function applies a set of filter coefficients selected in response to the signal in response to the user-controlled input.

40. The method of claim 31:
wherein the step of storing estimation data comprises storing the estimation data in a memory having a plurality of storage units;
wherein each storage unit of the plurality of storage units has a bit storage capacity; and
wherein the step of applying a transfer function is performed by applying circuitry that has a fractional bit capacity greater than the bit storage capacity.

41. The method of claim 40:
wherein the estimation data comprises a plurality of modified offset values; and
wherein each modified offset value of the plurality of modified offset values represents a binary shifted offset value that is shifted in a first direction prior to being stored in the circuitry for storing estimation data.

42. The method of claim 41 and further comprising:
reading a modified offset value for use by the circuitry for applying a transfer function; and
shifting the read modified offset value in a second direction, opposite the first direction, prior to use by the circuitry for applying a transfer function.

43. The method of claim 41 wherein each fixed filter coefficient in the first set of fixed filter coefficients represents a binary shifted coefficient that is shifted in a first direction prior to being stored as a first set of fixed filter coefficients.

44. The method of claim 43 wherein the step of estimating a number of sets of estimated filter coefficients in response to the estimation data comprises adding a binary shifted offset value to a binary shifted coefficient.

* * * * *